US008192795B2

(12) United States Patent
Mirkin et al.

(10) Patent No.: US 8,192,795 B2
(45) Date of Patent: Jun. 5, 2012

(54) ETCHING AND HOLE ARRAYS

(75) Inventors: Chad A. Mirkin, Wilmette, IL (US);
Khalid Salaita, Berkeley, CA (US)

(73) Assignee: Northwestern University, Evanston, IL (US)

( * ) Notice: Subject to any disclaimer, the term of this patent is extended or adjusted under 35 U.S.C. 154(b) by 1331 days.

(21) Appl. No.: 11/770,477

(22) Filed: Jun. 28, 2007

(65) Prior Publication Data
US 2008/0182079 A1    Jul. 31, 2008

Related U.S. Application Data

(60) Provisional application No. 60/816,948, filed on Jun. 28, 2006.

(51) Int. Cl.
*B05D 5/00* (2006.01)
*B05D 1/28* (2006.01)
*B05D 3/10* (2006.01)
*B05D 3/14* (2006.01)

(52) U.S. Cl. ........ 427/264; 427/270; 427/271; 427/331; 427/430.1; 427/435; 427/287; 977/849; 977/855; 977/856; 977/857; 977/888

(58) Field of Classification Search .................. 427/256, 427/258, 261, 264, 265, 270, 271, 287, 355, 427/356, 259, 331, 430.1, 435; 977/849, 977/855–857, 863, 888
See application file for complete search history.

(56) References Cited

U.S. PATENT DOCUMENTS

| 5,443,791 | A | 8/1995 | Cathcart |
| 5,512,131 | A | 4/1996 | Kumar et al. |
| 5,618,760 | A | 4/1997 | Soh et al. |
| 5,618,850 | A | 4/1997 | Bamdad et al. |
| 5,635,047 | A | 6/1997 | Porter et al. |
| 5,705,814 | A | 1/1998 | Young et al. |
| 5,827,417 | A | 10/1998 | Porter et al. |
| 5,922,214 | A * | 7/1999 | Liu et al. ........................ 216/2 |
| 5,981,733 | A | 11/1999 | Gamble |
| 6,635,311 | B1 | 10/2003 | Mirkin et al. |
| 6,642,129 | B2 | 11/2003 | Liu et al. |
| 6,674,074 | B2 | 1/2004 | Schwartz |
| 6,737,646 | B2 | 5/2004 | Schwartz |
| 6,787,313 | B2 | 9/2004 | Morozov |
| 6,827,979 | B2 | 12/2004 | Mirkin et al. |
| 6,867,443 | B2 | 3/2005 | Liu et al. |

(Continued)

FOREIGN PATENT DOCUMENTS

WO    WO 2005/101466 A2    10/2005
(Continued)

OTHER PUBLICATIONS

An Introduction to Ultrathin Organic Films from Langmuir-Blodgett to Self-Assembly, *Academic Press, Inc.*, Abraham Ulman, ed., 1991.

(Continued)

*Primary Examiner* — William Phillip Fletcher, III
(74) *Attorney, Agent, or Firm* — Foley & Lardner LLP

(57) ABSTRACT

Lithographic and nanolithographic methods that involve patterning a first compound on a substrate surface, exposing non-patterned areas of the substrate surface to a second compound and removing the first compound while leaving the second compound intact. The resulting hole patterns can be used as templates for either chemical etching of the patterned area of the substrate or metal deposition on the patterned area of the substrate.

26 Claims, 13 Drawing Sheets

U.S. PATENT DOCUMENTS

| | | | |
|---|---|---|---|
| 7,005,378 | B2 | 2/2006 | Crocker et al. |
| 7,034,854 | B2 | 4/2006 | Cruchon-Dupeyrat et al. |
| 7,060,977 | B1 | 6/2006 | Dupeyrat et al. |
| 7,098,058 | B1 | 8/2006 | Karpov |
| 7,279,046 | B2 | 10/2007 | Eby et al. |
| 7,887,885 | B2 * | 2/2011 | Mirkin et al. ............ 427/259 |
| 2002/0122873 | A1 | 9/2002 | Mirkin et al. |
| 2003/0068446 | A1 | 4/2003 | Mirkin et al. |
| 2003/0162004 | A1 | 8/2003 | Mirkin et al. |
| 2003/0185967 | A1 | 10/2003 | Eby et al. |
| 2004/0002225 | A1 | 1/2004 | Wong et al. |
| 2004/0026681 | A1 | 2/2004 | Cruchon-Dupeyrat et al. |
| 2004/0175631 | A1 | 9/2004 | Crocker et al. |
| 2004/0228962 | A1 | 11/2004 | Liu et al. |
| 2005/0009206 | A1 | 1/2005 | Mirkin et al. |
| 2005/0235869 | A1 | 10/2005 | Cruchon-Dupeyrat et al. |
| 2005/0255237 | A1 | 11/2005 | Zhang et al. |
| 2006/0081479 | A1 | 4/2006 | Mirkin et al. |

FOREIGN PATENT DOCUMENTS

| | | |
|---|---|---|
| WO | WO 2005/115630 | 12/2005 |

OTHER PUBLICATIONS

Bottomley, L. A., "Scanning Probe Microscopy", Anal. Chem., vol. 70, pp. 425R-475R (1998).
Calvert, J. M., et al,. "Deep ultraviolet patterning of monolayer films for high resolution lithography", J. Vac. Sci. Technol. B, vol. 9, No. 6, pp. 3447-3450 (1991).
Deladi, S., et al., "Micromachined fountain pen for atomic force microscope-based nanopatterning", Appl. Phys. Letts. vol. 85, No. 22, pp. 5361-5363 (2004).
Delamarche, E., "Positive Microcontact Printing", J. Am. Chem. Soc., vol. 124, pp. 3834-3835 (2002).
Demers, L. M., et al., "Direct Patterning of Modified Oligonucleotides on Metals and Insulators by Dip-Pen Nanolithography", Science, vol. 296, pp. 1836-1838 (2002).
Direct-Write Technologies for Rapid Prototyping Applications: Sensors, Electronics, and Integrated Power Sources, *Academic Press* (Eds. A . Pique and D. B. Chrisey), pp. 617-619 (2002).
Dulcey, C. S., et al., "Deep UV Photochemistry of Chemisorbed Monolayers: Patterned Coplanar Molecular Assemblies", Science, vol. 252, pp. 551-554 (1991).
Ebbesen, T. W., "Extraordinary optical transmission through sub-wavelength hole arrays", Nature, vol. 391, pp. 667-669 (1998).
Felgenhauer, T., et al., "Electrode modification by electron-induced patterning of aromatic self-assembled monolayers", Appl. Phys. Letts., vol. 79, No. 20, pp. 3323-3325 (2001).
Gates, B. D., et al., "New Approaches to nanofabrication: Molding, Printing, and Other Techniques", Chem. Rev., vol. 105, pp. 1171-1196 (2005).
Geyer, W., et al., "Electron-induced crosslinking of aromatic self-assembled monolayers: Negative resists for nanolithography", Appl. Phys. Letts., vol. 75, No. 16, pp. 2401-2403 (1998).
Gillen, G., et al., "Patterning of self-assembled alkanethiol monolayers on silver by microfocus ion and electron beam bombardment", Appl. Phys. Lett., vol. 65, No. 5, pp. 534-536 (1994).
Ginger, D. S., et al., "The Evolution of Dip-Pen Nanolithography", Angew. Chem. Int. Ed., vol. 43, pp. 30-45 (2004).
Gölzhäuser, A, et al., "Chemical Nanolithography with Electron Beams", Adv. Mater., vol. 13, No. 11, pp. 806-809 (2001).
Gölzhäuser, A, et al., "Nanoscale patterning of self-assembled monolayers with electrons", J. Vac. Sci. Technol. B, vol. 18, No. 6, pp. 3414-3418 (Nov./Dec. 2000).
Hallmark, V. M., "Observation of Atomic Corrugation on Au(111) by Scanning Tunneling Microscopy", Phys. Rev. Letts., vol. 59, No. 25, pp. 2879-2882 (1987).
Hobara, D., et al., "In-Situ Scanning Tunneling Microscopy Imaging of the Reductive Desorption Process of Alkanethiols on Au(111)", Langmuir, vol. 14, pp. 3590-3596 (1998).
Hong, M., et al., "Scanning nanolithography using a material-filled nanopipette", Appl. Phys. Letts., vol. 77, No. 16, pp. 2604-2606 (2000).
Hong, S., et al., "A New Tool for Studying the in Situ Growth Processes for Self-Assembled Monolayers under Ambient Conditions", Langmuir, vol. 15, pp. 7897-7900 (1999).
Hong, S., et al., "Multiple Ink Nanolithography: Toward a Multiple-Pen Nano-Plotter", Science, vol. 286, pp. 523-525 (1999).
Imabayashi, S., et al., "Reductive desorption of carboxylic-acid-terminated alkanethiol monolayers from Au(111) surfaces", J. Electroanal. Chem., vol. 428, pp. 33-38 (1997).
Ivanisevic, A., et al., "Site-Directed Exchange Studies with Combinatorial Libraries of Nanostructures", J. Am. Chem. Soc., vol. 124, pp. 11997-12001 (2002).
Kaltenpoth, G., et al., "Electrode modification by electron-induced patterning of self-assembled monolayers", J. Vac. Sci. Technol. B, vol. 20, No. 6, pp. 2734-2738 (2002).
Kamrava, S. J., et al., "Polyacetylene as heterogeneous catalyst for electroless deposition of bulk amorphous metals", J. Mater. Res., vol. 5, No. 8, pp, 1697-1702 (1990).
Kim, K., et al., "A Nanofountain Probe with Sub-100 nm Molecular Writing Resolution", Small, vol. 1, No. 6, pp. 632-635 (2005).
Kramer, S., et al., "Scanning Probe Lithography Using Self-Assembled Monolayers", Chem. Rev., vol. 103, pp. 4367-4418 (2003).
Kumar, A., et al., "Patterning Self-Assembled Monolayers: Applications in Materials Science", Langmuir, vol. 10, pp. 1498-1511 (1994).
Kumar, A., et al., "The Use of Self-Assembled Monolayers and a Selective Etch to Generate Patterned Gold Features", J. Am. Chem. Soc., vol. 114, pp. 9188-9189 (1992).
Lewis, A., et al., "Fountain pen nanochemistry: Atomic force control of chrome etching", Appl. Phys. Letts., vol. 75, No. 17, pp. 2689-2691 (1999).
Li, Y., et al., "Electrochemical scanning tunneling microscopy study of the electrochemical behavior of naked and n-alkanethiol-modified Au(111) surfaces in F⁻ and CN⁻ -containing electrolyte solutions", J. Vac. Sci. Technol. B, vol. 13, No. 3, pp. 1300-1306 (1995).
Lim, J., et al., "Direct-Write Dip-Pen Naolithography of Proteins on Modified Silicon Oxide Surfaces", Angew. Chem. Int. Ed., vol. 42, pp. 2309-2312 (2003).
Liu, X., et al., "Arrays of Magnetic nanoparticles Patterned via 'Dip-Pen' Nanolithography", Adv. Mater., vol. 14, No. 3, pp. 231-234 (2002).
Marrian, C. R. K., et al., "Low voltage electron beam lithography in self-assembled ultrathin films with the scanning tunneling microscope", Appl. Phys. Lett., vol. 64, No. 3, pp. 390-392 (1994).
McCarley, R. L., et al., "Surface Reactions of Au(111) with Aqueous Cyanide Studies by Scanning Tunneling Microscopy", J. Phys. Chem., vol. 96, pp. 7410-7416 (1992).
Meister, A., et al., "Nanoscale dispensing of liquids through cantilevered probes", Microelec. Eng. vol. 67-68, pp. 644-650 (2003).
Nakahara, S., et al., "Microstructure and Mechanical Properties of Electroless Copper Deposits", Annu. Rev. Mater. Sci., vol. 21, pp. 93-129 (1991).
Noy, A, et al., "Fabrication of Luminescent Nanostructures and Polymer Nanowires Using Dip-Pen Nanolithography", Nano Letts., vol. 2, No. 2, pp. 109-112 (2002).
Odom, T. W., et al., "Improved Pattern Transfer in Soft Lithography Using Composite Stamps", Langmuir, vol. 18, pp. 5314-5320 (2002).
Ohno, I., "Electrochemistry of electroless plating", Mater. Sci. Eng., vol. A146, pp. 33-49 (1991).
Penner, R. M., et al., "Mesoscopic Metal Particles and Wires by Electrodeposition", J. Phys. Chem. B, vol. 106, pp. 3339-3353 (2002).
Pesika, N. S., et al., "Site-Selective Patterning Using Surfactant-Based Resists", J. Am. Chem. Soc., vol. 127, pp. 11960-11962 (2005).
Piner, R. D., et al., "'Dip-Pen' Nanolithography", Science, vol. 283, pp. 661-663 (1999).
Rosi, N. L. et al., "Nanostructures in Biodiagnostics", Chem. Rev., vol. 105, pp. 1547-1562 (2005).
Saalmink, M., et al., "Positive Microcontact Printing with Mercaptoalkyloligo(ethylene glycol)s", Langmuir, vol. 22, pp. 1016-1026 (2006).

Salaita, K., et al., "Sub-100 nm, Centimeter-Scale, parallel Dip-Pen Nanolithography", Small, vol. 1, No. 10, pp. 940-945 (2005).

Seidel, H., et al., "Anisotropic Etching of Crystalline Silicon in Alkaline Solutions", J. Electrochem. Soc., vol. 137, No. 11, pp. 3612-3626 (1990).

Sondag-Huetorst, J. A. .M., et al., "Generation of electrochemically deposited metal patterns by means of electron beam (nano)lithography of self-assembled monolayer resists", Appl. Phys. Lett., vol. 64, No. 3, pp. 285-287 (1994).

Taha, H., et al., "Protein printing with an atomic force sensing nanofountainpen", Appl. Phys. Letts., vol. 83, No. 5, pp. 1041-1043 (2003).

Völkel, B., et al., "Electrodeposition of copper and cobalt nanostructures using self-assembled monolayer templates", Surface Science, vol. 597, pp. 32-41 (2005).

Walczak, M. M., et al., "Reductive Desorption of Alkanethiolate Monolayers at Gold: A Measure of Surface Coverage", Langmuir, vol. 7, pp. 2687-2693 (1991).

Weinberger, D. A., et al., "Combinatorial Generation and Analysis of Nanometer- and Micrometer-Scale Silicon Features via 'Dip-Pen' Nanolithography and Wet Chemical Etching", Adv. Mater, vol. 12, No. 21, pp. 1600-1603 (2000).

Widrig, C. A., et al., "The electrochemical desorption of n-alkanethiol monolayers from polycrystalline Au and Ag electrodes", J. Electroanal. Chem., vol. 310, pp. 335-359 (1991).

Xia, Y., et al., "A Selective Etching Solution for Use with Patterned Self-Assembeld Monolayers of Alkanethiolates on Gold", Chem. Mater., vol. 7, pp. 2332-2337 (1995).

Xia, Y., et al., "Soft Lithography", AngewChem. Int. Ed., vol. 37, pp. 550-575 (1998).

Zamborini, F. P., et al., "In-Situ Electrochemical Scanning Tunneling Microscopy (ECSTM) Stuidy of Cyanide-Induced Corrosion of Naked and Hexadecyl Mercaptan-Passivated Au(111)", Langmuir, vol. 13, pp. 122-126 (1997).

Zhang, H. et al., DPN-Generated Nanostructures Made of Gold, Silver, and Palladium, Chem. Mater., vol. 16, pp. 1480-1484 (2004).

Zhang, H., et al., "Biofunctionalized nanoarrays of inorganic structures prepared by dip-pen nanolithography", Nanotechnology, vol. 14, pp. 1113-1117 (2003).

Zhang, H., et al., "Dip-Pen Nanolithography-Based Methodology for Preparing Arrays of Nanostructures Functionalized with Oligonucleotides", Adv. Mater., vol. 14, No. 20, pp. 1472-1474 (2002).

Zhang, H., et al., "Fabrication of Sub-50-nm Solid-State Nanostructures on the Basis of Dip-Pen Nanolithography", Nano Letts., vol. 3, No. 1, pp. 43-45 (2003).

Zhang, H., et al., "Synthesis of Open-Ended, Cylidrical Au—Ag Alloy Nanostructures on a $Si/SiO_x$ Surface", Nano Letts., vol. 4, No. 8, pp. 1493-1495 (2004).

Zhang, Y., et al., "A Massively Parallel Electrochemical Approach to the Miniaturization of Organic Micro- and Nanostructures on Surfaces", Langmuir, vol. 20, pp. 962-968 (2004).

Zhang, Y., et al., "Electrochemical Whittling of Organic Nanostructures", Nano Letts., vol. 2, No. 12, pp. 1389-1392 (2002).

Zharnikov, M., et al., "Modification of alkanethiolate monolayers on Au-substrate by low energy electron irradiation: Alkyl chains and the S/Au interface", Phys. Chem. Chem. Phys., vol. 1, pp. 3163-3171 (1999).

Zhou, C., et al., "Toward Molecular Electronic Circuitry: Selective Deposition of Metals on Patterned Self-Assembled Monolayer Surfaces", J. Am. Chem. Soc., vol. 127, pp. 12160-12161 (2005).

International Search Report and Written Opinion mailed Sep. 16, 2008 in International Application No. PCT/US2007/015009.

Examination Report mailed Oct. 27, 2009 in European Application No. 07 872 537.1.

* cited by examiner

ETCHING AND HOLE ARRAYS

RELATED APPLICATIONS

This application claims priority to U.S. provisional application No. 60/816,948 filed Jun. 28, 2006, which is incorporated herein by reference in its entirety.

STATEMENT ON FEDERAL FUNDING

The presently claimed inventions were developed with use of federal funding from NSF-NSEC, Grant No. EEC 011-8025, DARPA-ARD, Grant No. DAAD 19-03-1-0065 and AFOSR/MURI Grant No. F49-620-00-1-0283. The federal government may have certain rights in the inventions.

BACKGROUND

Nanostructured metal surfaces currently play an important role in electronics, optics, biodiagnostics and catalysis (1-3—see reference listing hereinafter). Similar to a photoresist in conventional photolithography, self-assembled monolayers (SAMs) of alkanethiols have been utilized as masks to direct the patterning of underlying thin metal films. Such a patterning has relied on at least two approaches. A first approach is an indirect approach, in which a focused ion (4) or electron beam (5-8), photoradiation (9-10) or a scanning probe microscope tip (11) locally excites or degrades an adsorbed monolayer. In most cases, the monolayer is damaged or destroyed (12-13), but in some cases, the monolayer's cross-linking is effected (14). SAMs patterned using the indirect approach have been utilized as masks to control the electrodeposition of metal salts or substrate etching at the exposed regions of thin metal films (5, 7, 15-17). Still, the indirect patterning of alkanethiols is a low-throughput process that typically requires serial scanning with an exception of photolithographic methods with limited patterning resolution.

A second approach of alkanethiol patterning uses direct deposition tools, such as micro-contact printing (μCP) (18) or dip-pen nanolithography (DPN) printing (19, 20) to directly deposit alkanethiols onto a thin metal film. μCP and its variants allow for massively parallel printing organic compounds on surfaces while controlling feature size typically down to about 200 nm. μCP generated patterns of hexadecanethiol ($CH_3(CH_2)_{15}SH$) have been used as a mask for the electroless deposition of Ni on Au (3). μCP patterned alkanethiols of various lengths can be used to direct the electrodeposition of Ag and Au salts depending on the applied potential (21).

DPN printing is a direct-write tool for tailoring the chemical composition of surfaces on the sub-50 nm to many micrometer length scale (19, 20). Small organic molecules (20, 22-24), oligonucleotides (25), proteins (26), conducting polymers (27) and sol gels (28) have been patterned on inorganic substrates, such as Au, Ag, and $SiO_x$, using DPN printing. DPN-patterned alkanethiols can be used as negative chemical etch resists for generating a variety of inorganic nanostructures. For example, 16-mercaptohexadecanoic acid (MHA) and 1-octadecanethiol (ODT) were each used as chemical etch resists to generate 12 nm gaps and sub-50 nm metal disks comprising Au, Ag, or Pt on a silicon substrate (29-33).

Approaches using alkanethiols as a positive etch resist have been proposed and demonstrated for μCP using bulky or poorly ordered adsorbates that provide high adsorbate solution exchange resistance, but are poor etch resists (34, 35).

SUMMARY

One embodiment provides, for example, a method comprising: providing a tip and a substrate; applying a first compound from the tip to a surface of the substrate to produce a patterned area; depositing a second compound on a non-patterned area of the surface by exposing the substrate to the second compound; selectively removing the first compound from the patterned area of the surface so that the second compound on the non-patterned area of the surface remains deposited on the non-patterned area; and then etching the patterned area of the surface.

Another embodiment provides a method comprising: providing a tip and a substrate; applying a first compound from the tip to a surface of the substrate to produce a patterned area; depositing a second compound on a non-patterned area of the surface by exposing the substrate to the second compound; selectively removing the first compound from the patterned area of the surface so that the second compound on the non-patterned area of the surface remains deposited on the non-patterned area; and depositing a material on the patterned area of the surface. The material can be, for example, a conductive material or semiconductive material such as a metal or conducting polymer or conjugated polymer.

Another embodiment provides a method comprising: providing a nanoscopic tip and a solid substrate; disposing a composition comprising a first compound on the tip; depositing the first compound from the tip to a surface of the substrate to produce a patterned area, wherein the first compound forms a self-assembled monolayer on the surface; depositing a second compound on a non-patterned area of the surface by exposing the substrate to the second compound, wherein the second compound forms a self-assembled monolayer on the surface; selectively electrochemically removing the first compound from the patterned area of the surface so that the second compound on the non-patterned area of the surface remains deposited on the non-patterned area; and etching the patterned area of the surface.

Advantages of one or more embodiments include ability to selectively desorb similar molecules from a surface; use of electrochemical approaches to desorption; good throughput; high resolution; and combination of good throughput and high resolution, among other things. For example, resolution can be micro to sub-100 nm lateral resolution and can be controlled as needed for an application.

DETAILED DESCRIPTION

Introduction

Figure 1:
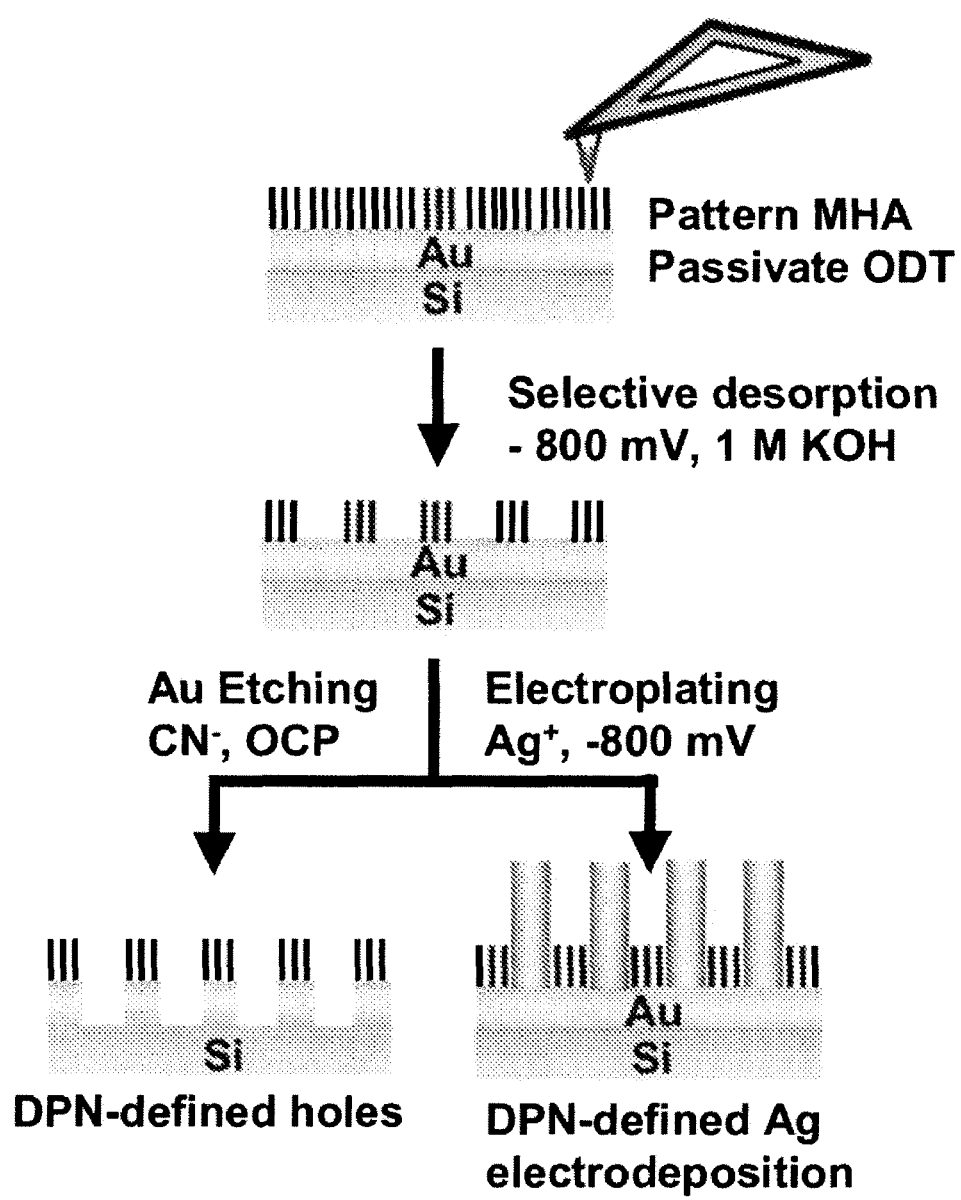
FIG. 1 is a diagram illustrating making hole arrays using DPN and subsequent generation arrays of solid state features.

References will be made in detail to the preferred embodiments, examples of which are illustrated in the accompanying drawings. While the many facets of the inventions described will be described in conjunction with the preferred embodiments, it will be understood that they are not intended to limit the inventions to those embodiments. On the contrary, the inventions are intended to cover alternatives, modifications and equivalents, which may be included within the spirit and scope of the inventions as defined by the appended claims.

Nanolithography instruments and accessories for direct-write printing can be obtained from NanoInk, Inc., Chicago, Ill. Dip Pen Nanolithography™ and DPN™ are NanoInk, Inc. trademarks.

The following patents and co-pending applications related to direct-write printing with use of cantilevers, tips, and patterning compounds are hereby incorporated by reference in their entirety:

U.S. Pat. No. 6,635,311 issued Oct. 21, 2003 ("Methods Utilizing Scanning Probe Microscope Tips and Products Therefor or Produced Thereby") to Mirkin et al., which describes fundamental aspects of DPN printing including inks, tips, substrates, and other instrumentation parameters and patterning methods;

U.S. Pat. No. 6,827,979 issued Dec. 7, 2004 ("Methods Utilizing Scanning Probe Microscope Tips and Products Therefor or Produced Thereby") to Mirkin et al., which further describes fundamental aspects of DPN printing including software control, etching procedures, nanoplotters, and arrays formation.

U.S. patent publication number 2002/0122873 A1 published Sep. 5, 2002 ("Nanolithography Methods and Products Produced Therefor and Produced Thereby"), which describes aperture embodiments and driving force embodiments of DPN printing.

U.S. patent publication 2003/0185967 to Eby et al., published Oct. 2, 2003 ("Methods and Apparatus for Aligning Patterns on a Substrate"), which describes alignment methods for DPN printing.

U.S. Pat. No. 7,060,977 to Dupeyrat et al., issued Jun. 13, 2006 ("Nanolithographic Calibration Methods"), which describes calibration methods for DPN printing.

U.S. Patent Publication 2003/0068446, published Apr. 10, 2003 to Mirkin et al. ("Protein and Peptide Nanoarrays"), which describes nanoarrays of proteins and peptides;

U.S. Regular pPtent Application, Ser. No. 10/307,515 filed Dec. 2, 2002 to Mirkin et al. ("Direct-Write Nanolithographic Deposition of Nucleic Acids from Nanoscopic Tips"), which describes nucleic acid patterning.

U.S. Patent Publication 2003/0162004 to Mirkin et al. published Aug.28, 2003 ("Patterning of Solid State Features by Direct-Write Nanolithographic Printing"), which describes reactive patterning and sol gel inks.

U.S. Pat. No. 6,642,129, issued Nov. 4, 2003, to Liu et al. ("Parallel, Individually Addressable Probes for Nanolithography").

U.S. Pat. No. 6,737,646, issued May 18, 2004, to Schwartz ("Enhanced Scanning Probe Microscope and Nanolithographic Methods Using Same").

U.S. Pat. No. 6,674,074 issued Jan. 6, 2004, to Schwartz ("Enhanced Scanning Probe Microscope").

U.S. Pat. No. 7,098,058 issued Aug. 29, 2006.

U.S. Patent publication 2004/0026681 published Feb. 12, 2004.

U.S. Pat. No. 7,005,378 issued Feb. 28, 2006.

U.S. Patent Publication 2004/0175631 published Sep. 9, 2004.

U.S. Pat. No. 7,034,854 issued Apr. 25, 2006.

U.S. Patent Publication 2005/0009206 published Jan. 13, 2005.

U.S. Patent Publication 2005/0272885 published Dec. 8, 2005.

U.S. Patent Publication 2005/0255237 published Nov. 17, 2005.

U.S. Patent Publication 2005/0235869 published Oct. 27, 2005.

In some embodiments, the direct-write nanolithography methods described herein can be particularly of interest for use in preparing bioarrays, nanoarrays, and microarrays based on peptides, proteins, nucleic acids, DNA, RNA, viruses, and the like. See, for example, U.S. Pat. No. 6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications;

Direct write methods, including DPN printing, are described in for example *Direct-Write Technologies, Sensors, Electronics, and Integrated Power Sources*, Pique and Chrisey (Eds), 2002.

Scanning probe microscopy is reviewed in Bottomley, *Anal. Chem.*, 1998, 70, 425R-475R.

Scanning probe microscopes are known in the art including probe exchange mechanisms as described in U.S. Pat. No. 5,705,814 (Digital Instruments).

In addition, the following papers describes wet chemical etching procedures used in conjunction with direct-write nanolithography, and is hereby incorporated by reference in its entirety including figures, references, and working examples: Zhang et al., "Dip-Pen Nanolithography-Based Methodology for Preparing Arrays of Nanostructures Functionalized with Oligonucleotides"; *Adv. Mat.*, 2002, 14, No. 20, October 16, pages 1472-1474; Zhang et al., "Biofunctionalized Nanoarrays of Inorganic Structures Prepared by Dip-Pen Nanolithography"; Nanotechnology, 2003, 14, 1113-1117.

The text *Fundamentals of Microfabrication, The Science of Minitaturization*, $2^{nd}$ Ed., Marc J. Madou, describes micro and nanotechnologies including additive and substractive methods, for example, lithography (Chapter 1), pattern transfer with dry etching methods (Chapter 2), pattern transfer with additive methods (Chapter 3), and wet bulk micromachining (Chapter 4).

Also, the text *Direct-Write Technologies for Rapid Prototyping Applications: Sensors, Electronics, and Integrated Power Sources* (Eds. A. Pique and D. B. Chrisey), describes micro and nanotechnologies including additive and substractive methods. For example, bulk micromachining and etching are described on pages 617-619. DPN printing on the Sub-100 nanometer length scale is described in Chapter 10.

Self-assembled monolayers, etching, and microfabrication are further described in, for example, U.S. Pat. No. 5,618,760 to Soh et al. U.S. Pat. No. 5,620,850 to Bamdad et al.; and U.S. Pat. No. 5,512,131 to Kumar et al.

US patent publication No. US 2006/018479 to Mirkin et al. published Apr. 20, 2006, discloses methods of electrochemical miniaturization of organic micro and nanostructures.

In addition, U.S. Pat. Nos. 5,827,417 and 5,635,047 relate to electrochemical methods of controlling thiolate coverage on a conductive substrate such as gold.

Provided herein is a method that includes patterning a first compound on a surface of a substrate, passivating a non-patterned area of the surface with a second compound and then removing the first compound from the patterned area, while leaving the second compound intact. The hole pattern formed after the removal of the first compound can be used as a template that can either guide etching of the patterned area of the surface or direct metal deposition to the patterned area of the surface.

The method has at least three advantages. First, the method is a maskless technique that does not require expensive high-quality masters. As a result, rapid prototyping of patterns having a variety of feature sizes and spacings can be performed a greater ease. Second, the method does not require the use of a clean room and can rely instead on wet chemical approaches. The wet chemical based approaches can allow for precise immobilization of reagents site-specifically to the generated patterns. Finally, the method can be amenable to massive parallelization.

Tip

The tip embodiment will be further described. Tips known in art of DPN printing can be used. Sharp tips can be used which are characterized by a sharp, pointed end. The tip can be for example a nanoscopic tip. The tip can be for example a scanning probe microscope tip or an atomic force microscope tip. Tips can be engineered to be useful for scanning probe or AFM measurements if suitably adapted with cantilever and feedback mechanism. The tip can be a hollow tip or a solid tip. The tip can comprise a channel for delivery of a patterning compound. Tips including solid and hollow tips are further described in for example U.S. Pat. Nos. 6,635,311 and 6,827,979, as well as 2002/0122873, which are herein incorporated by reference in their entirety. WO 2005/115630 to Henderson et al, published Dec. 8, 2005, also describes an elongated beam with elongated aperture for deposition on surfaces. See also US Patent Publication 2006/0096078 to Bergaud et al. for deposition based on slit or groove technology; see also, Espinosa et al., Small, 1, No. 6, 632-635, 2005 for nanofountain probe writing; Lewis et al., Appl. Phys. Lett., 1999, 75, 2689-2691; Taha et al., Appl. Phys. Lett., 2003, 83, 1041-1043; Hong et al, Appl. Phys. Lett., 2000, 77, 2604-2606; Meister et al., Microelectron. Eng., 2003, 67-68, 644-650; Deladi et al., Appl. Phys. Lett., 85, 5361-5363.

Tips can comprise hard inorganic, ceramic materials, or softer organic materials. Semiconductor materials can be used. Insulative and conductive materials can be used. Tips known in the art of AFM imaging, for example, can be used including silicon or silicon nitride. For example, polymer or polymer-coated tips can be used. See, for example, US Patent Publication No. 2005/0255237 to Zhang et al, which is herein incorporated by reference in its entirety. Polymer tips and cantilevers are described in, for example, Mirkin and Liu, US Patent Publication No. 2004/0228962, related to scanning probe contact printing.

The tip disposed on the cantilever can be part of a larger structure comprising a plurality of tips disposed on a plurality of cantilevers. These can be called multipen structures or parallel pen structures. For example, the multipen structure can have over 20, or over 100, or over 1,000, or over 10,000, or over 100,000, or over 1,000,000 individual tips. The cantilevers and tips can be adapted for individual actuation, wherein one tip can be raised or lowered independently of another tip. Individual actuation is described in for example U.S. Pat. Nos. 6,867,443 and 6,642,129 to Liu et al, which are hereby incorporated by reference in their entirety. Electrostatic or thermal actuation can be used.

Tips can be thermally heated and activated for temperature control.

Substrate

The substrate surface can be a surface of a variety of substrates particularly solid substrates. Smother substrates are generally preferred for providing pattern's higher resolution. The substrate can comprise, for example, a metal, a semiconductor, an insulator, a magnetic material, a polymer material, a ceramic material or a superconducting material. For example, the substrate can comprise silica, silicon oxide $SiO_x$, GaAs, InP, InAs or glass. In some embodiments, a surface of the substrate can be a metal surface comprising, for example, gold, silver, platinum or palladium.

Patterning

The first compound can be transported to the substrate's surface from a tip to form a pattern in several different ways and is not particularly limited. Applying the first compound to the surface results in formation of a patterned area of the surface, i.e. the area of the surface, where the first compound was applied to, and a non-patterned area of the surface, i.e. the area of the surface, wherein the first compound was not applied. Known methods in DPN printing can be used for patterning the first compound. For instance, in scanning probe and AFM-related technology, different modes can be used to have tips interact with surfaces, which include contact mode, non-contact mode and intermittent contact mode or tapping mode. Cantilevers can be oscillated. Known feedback methods can be used for positioning and alignment the X, Y and Z directions.

The transporting of the first compound from the tip to the surface can be carried out by moving the tip only in the Z direction up and down with respect to the XY plane of the substrate surface. The delivery can be performed without translating the tip over the substrate surface, moving in the XY plane. Alternatively, the tip can be translated over the surface, moving in the XY plane.

The transporting can be carried out under conditions such as humidity, temperature, and gaseous atmosphere which provide for a water meniscus between the tip and surface. For example, humidity can be at least about 25%, or at least about 40%, or at least bout 50%. Conditions can be controlled with use of environmental chambers. The gaseous atmosphere can be air, an inert atmosphere, an atmosphere with controlled humidity, or with the presence of other volatile or gaseous compounds such as vapors of organic compounds or volatile solvents such as alcohols like methanol or ethanol. Conditions can be selected to not favor a water meniscus including, for example, anhydrous conditions or conditions wherein all reagents and surfaces are selected to be free of water.

The transporting can be done manually or by instrument with computer control. Software can be used which can facilitate pattern design, calibration, leveling, and alignment. Calibration methods are described in for example U.S. Pat. No. 7,060,977 to Cruchon-Dupeyrat et al., which is hereby incorporated by reference. Alignments methods are describe in for example 2003/0185967 to Eby et al., which is hereby incorporated by reference.

The transporting can be done more than once, repetitively, in either the same spot or at different locations.

Patterning Composition and Compound

The first compound can be a compound that can chemisorb or covalently bind to the surface. When the surface comprises metal such as gold, silver, palladium or platinum, the first compound can be an organic compound containing sulfur, selenium or tellurium atom. For instance, the first compound can be an organic compound containing a thiol, disulfide, sulfide, selenol, selenide, diselenide, tellurol, telluride or ditelluride group. Preferably, the first compound is a organic compound capable of forming a self-assembled monolayer, preferably an ordered self-assembled monolayer, on the surface of the substrate. Compounds capable of forming ordered self-assembled monolayers are known to those of ordinary skill in the art, see e.g. A. Ulman, An Introduction to Ultrathin Organic Films: From Langmuir—Blodgett to Self-Assembly, Academic Press, San Diego, 1991. Compounds capable of forming ordered self-assembled monolayers include compounds that contain long chain alkane group, i.e. alkane group containing more than 8 or more than 10 or more than 12 carbon atoms. Examples of compounds capable of forming ordered self-assembled include but not limited to long chain alkane thiols, such as 16-mercaptohexadecanoic acid, and 1-octadecanethiol and long chain alkane selenols, such as octadecaneselenol.

Upon patterning the first compound, a plurality of dots or a plurality of lines can be formed on the surface of the substrate. The plurality of dots can be a lattice of dots including hexagonal or square lattices as known in the art. The plurality of lines can form a grid, including perpendicular and parallel arrangements of the lines. Individual lines of the plurality can be straight or non-straight lines. For example, the non-straight lines can form individual patterns of various polygon shapes such as triangle, square, rhomb, rectangle etc.

The lateral dimensions of the individual patterns including dot diameters and the line widths can be, for example, about 2,000 or less, about 1,000 nm or less, about 500 nm or less, about 200 nm or less, and more particularly about 100 nm or less. The range in dimension can be, for example, about 1 nm to about 750 nm, about 10 nm to about 2,000 nm, about 10 nm to about 500 nm, and more particularly about 100 nm to about 350 nm.

The number of patterns in the plurality of patterns is not particularly limited. It can be, for example, at least 10, at least 100, at least 1,000, at least 10,000, even at least 100,000. Square arrangements are possible such as, for example, a 10×10 array. High density arrays can be preferred.

The distance between the individual patterns on the nanoarray can vary and is not particularly limited. For example, the patterns can be separated by distances of less than one micron or more than one micron. The distance can be, for example, about 300 to about 1,500 microns, or about 500 microns to about 1,000 microns. Distance between separated patterns can be measured from the center of the pattern such as the center of a dot or the middle of a line.

The method can be also applied for forming patterns of larger scales such as micron scale, millimeter scale or centimeter scale. Such larger patterns can be prepared, for example, utilizing microcontact printing.

Second Compound

Like the first compound, the second compound can be a compound that can chemisorb or covalently bind to the surface of the substrate. Preferably, the second compound has a more negative of threshold desorption potential than the first compound. For example, for a substrate comprising Au, if the first compound is 16-mercaptohexadecanoic acid (threshold desorption potential −750 mV vs Ag/AgCl in 0.5 M KOH aqueous solution), the second compound can be any compound having a desorption potential more negative than −750 mV vs Ag/AgCl in 0.5 M KOH solution, such as octadecane thiol (threshold desorption potential −850 mV vs Ag/AgCl).

An area of the substrate not patterned by the first compound can be exposed to the second compound so that the second compound is retained on the non-patterned area of the substrate's surface. Such exposing can be performed using any applicable method. For example, the second compound can be disposed on the non-patterned part of the surface using any of the described patterning technique. Still, it is more preferable to expose the area of the substrate not patterned by the first compound using a non-patterning technique, i.e. the whole surface of the substrate can be exposed to a medium containing the second compound so that the second compound chemisorbs or binds to the non-patterned part of the substrate surface. Such non-patterning deposition can be performed by immersing the surface of the substrate in a solution containing the second compound or by exposing the surface of the substrate to a vapor containing the second compound.

Removing First Compound

Removing the first compound, while keeping the second compound intact can be performed using a variety of methods. A preferable method is selective electrochemical desorption, which can be performed by applying to the substrate a potential more negative than a threshold desorption potential of the first compound but still less negative than a threshold desorption potential of the second compound. Particular conditions, such as desorption time and desorption potential used for removing the first compound can depend, for example, on a particular type of the substrate, on a particular type of solution used for removing and on particular first and second compounds used. The removing conditions can be optimized as described in the working example below.

Preferably, removing the first compound results in removing all or the majority of the molecules of the first compound from the substrate.

Electrochemical desorption of thiols is disclosed, for example, in U.S. Pat. Nos. 5,827,417 and 5,635,047.

Selective electrochemical desorption is disclosed, for example, in US patent publication No. 2006/0081479.

Hole Patterns

Removing of the first compound exposes a surface of the substrate formerly covered by the first compound and thus forms a hole or a negative pattern surrounded by the second compound. Lateral dimensions of the hole are substantially defined by the lateral dimensions of the initial pattern formed by the first compound. The lateral dimensions of the hole can be equal to the lateral dimensions of the initial pattern formed by the first compound. The lateral dimensions of the hole can be also slightly smaller than the lateral dimensions of the initial pattern formed by the first compound, for example, due to the exchange between the first compound and the second compound. As the initial patterns formed by the first compound, the hole patterns can form a plurality of dots or lines. As the lateral dimensions, the spacing between the individual holes is defined by the original pattern formed by the first compound.

Etching

In some embodiments, upon removing the first compound, etching (wet or dry) can be applied to the substrate surface. In such a case, the second compound left intact can act as an etch resist and thus the etching can be limited only to the patterned area of the surface. Although, in general, wet (chemical) etching techniques are preferred, other types of etching can be used as well. The wet etching procedures and materials used in them are standard and well known in the art. See, e.g., Xia et al., *Angew. Chem. Int. Ed.*, 37 550 (1998); Xia et al., *Chem. Mater.*, 7, 2332 (1995); Kumar et al., *J. Am. Chem. Soc.*, 114, 9188-9189 (1992); Seidel et al., *J. Electrochem. Soc.*, 137, 3612 (1990). Wet etching procedures are used for, e.g., the preparation of three-dimensional architectures on or in substrates (e.g., Si wafers) of interest. See, e.g., Xia et al., *Angew. Chem. Int. Ed.*, 37, 550 (1998); Xia et al., *Chem. Mater.*, 7, 2332 (1995). After etching, the second compound may be retained on the substrate or removed from it. Methods of removing the compounds from the substrates are well known in the art. For example, electrochemical desorption can be used for removing the second compound from the unpatterned area of the substrate after etching.

Upon etching, the pattern initially formed by the first compound is transferred into a gap pattern. Lateral dimensions of individual gap features and spacing between the individual gap features are both defined by the initial pattern formed by the first compound.

Metal Deposition

In some embodiments, upon removing the first compound, metal can be deposited on the patterned area of the substrate. Metal deposition can be performed by any appropriate method.

In some embodiments, the metal deposition can be electroless deposition, i.e. deposition performed without applying an external current to the surface. For electroless deposition, the substrate can be exposed to a solution containing ions of the metal to be deposited and a reductant, such as dimethylamine borane (DMAB), hypophosphite ion, formaldehyde or hydrazine. The metal is deposited on the patterned area of the surface, while the metal deposition on the non-patterned area is prevented by the second compound, which acts as a metal deposition resist. Electroless metal deposition is known in the art, see e.g. Kumar, A.; Biebuyck, H. A.; Whitesides, G. M. *Langmuir* 1994, 10, 1498-1511; Nakahara, S.; Okinaka, Y. *Annu. Rev. Mater. Sci.* 1991, 21, 93-129; Kamrava, S. J.; Soederholm, S. *J. Mater. Sci.* 1990, 5, 1697-1702; Ohno, Izumi *Mater. Sci. Eng., A* 1991, A146, 33-49.

In some embodiments, the metal deposition can be electrochemical metal deposition. The electrochemical metal deposition is performed by exposing the substrate to a solution that containing ions of the metal to be deposited such as a solution of the metal's salt and applying a negative potential to the substrate. Similarly to the electroless deposition, the metal is deposited on the patterned area of the surface, while the metal deposition on the non-patterned area is prevented by the second compound, which acts as a metal deposition resist. The electrochemical metal deposition, also known as electroplating, is known in the art, see e.g. Pesika, N. S.; Fan, F. Q.; Searson, P. C.; Stebe, K. J. *J Am Chem Soc* 2005, 127, 11960-11962 and also working example of this application.

Metal deposition can result in formation a template (a positive pattern) of solid state structures comprising the metal in the patterned area of the substrate. Lateral dimensions of the individual solid structures and spacings between them are defined by the original pattern formed by the first compound. A height of the structures can be controlled by varying deposition time. In case of the electrochemical deposition, the height of the structures can be controlled by adjusting the total number of coulombs, i.e. a charge, passed through solution during the deposition.

Another embodiment comprises the step of depositing a material on the patterned area of the surface, wherein for example the material can be conductive or made to be conductive or semiconductive. For example, the conductive material can comprise a conjugated polymer such as polyaniline or polythiophene. A semiconductive material can be for example CdS or CdSe.

Stamp Fabrication

A pattern of solid structures fabricated via metal deposition as discussed can be used as a master, from which a large number duplicate structures could be fabricated. Such duplicates can fabricated by disposing a deformable material such as elastomer or one or more precursors of the deformable material on the solid structure pattern. One example of the elastomer can be a silicone elastomer or an elastomer with hydrophobic properties such as for example polydimethyl siloxane (PDMS). For forming PDMS duplicate, PDMS monomer and initiator can be disposed on the solid structure pattern and cured under elevated temperature. The formed duplicate has features that replicate the solid state structure pattern of the master. The formed duplicate can be used a stamp to generate features over large areas.

Embodiments described herein are further illustrated by, though in no way limited to, the following working examples.

Working Example

Experimental Section

Chemicals. 1-octadecanethiol (ODT) (98%), 16-mercaptohexadecanoic acid (MHA) (90%), KCN (97%), KOH (semiconductor-grade) were purchased from Aldrich Chemical Co. Ethanol (ACS/USP grade) was purchased from Pharmcoproducts Inc. Acetonitrile (reagent grade) and methylene chloride (99.9%) were purchased from Fisher Scientific. All chemicals were used as received.

Substrates, Patterning, and Imaging. In a typical experiment, Au-coated (20-60 nm), Ti-coated (5 nm) silicon oxide (Au/Ti/SiO$_x$/Si) prepared as detailed in (53) was patterned via DPN with MHA using an Atomic Force Microscope (AFM, CP, Veeco/ThermoMicroscopes, Sunnyvale, Calif.) equipped with a 100-μm scanner with closed-loop scan control, or an Nscriptor™ (Nanoink Inc., Chicago, Ill.) equipped with a 100-μm scanner and closed-loop scan control and commercial lithography software (DPNWrite™, DPN System-1, Nanoink Inc., Chicago, Ill.). Gold-coated Si$_3$N$_4$ AFM cantilevers (Microlever, Veeco/ThermoMicroscopes, Sunnyvale, Calif.) with a spring constant of 0.05 N/m and commercially available gold-coated Si$_3$N$_4$ multi-cantilever A-26 arrays with a spring constant of 0.097 N/m (NanoInk, Chicago, Ill.) were used for patterning. MHA-coated tips were prepared by immersing the cantilevers in acetonitrile solution saturated with MHA for a few seconds. The tips were then washed with a neat ethanol solution and subsequently blown dry under a stream of N$_2$.

Imaging of DPN-generated patterns was performed using a clean AFM tip under conditions identical to those used for patterning in contact mode. Patterned structures, post etching, were characterized by scanning electron microscope, SEM (Leo Gemini 1525) and dark field microscopy (Zeiss Axiovert 100A inverted microscope, Thornwood, N.Y.). The dark filed microscope was equipped with a Penguin 600CL digital camera and StreamPix software. Tapping mode AFM images were collected with a Nanoman AFM equipped with a Nanoscope IV.

Etching. CN$^-$-induced etching of substrates under potential control was performed in an electrochemical cell as described above, where the electrolyte was an alkaline solution containing KCN (54). The open-circuit potential (OCP) of an ODT-passivated Au substrate was about −520 mV (vs Ag/AgCl). The OCP was sufficiently positive to initiate dissolution of unprotected Au, and patterned substrates were immersed in the etching solution without stirring or mixing, and subsequently washed with Nanopure™ water and ethanol.

Electroplating. Silver cyanide/potassium cyanide plating solution (Technic Silver 1025) and potassium gold cyanide plating solution (Orotemp 24 plating solution) were purchased from Technic Inc., Cranston, R.I. Prior to use, solutions were passed through a syringe filter with a pore size of 0.2 μm. Deposition was performed at ambient conditions under potentiostatic control (typically −800 mV vs Ag/AgCl) while stirring mildly (~100 rpm). Substrates were washed with Nanopure™ water and ethanol respectively after deposition.

PDMS replica. Stamps were fabricated by placing a DPN-prepared master (by using the procedure describe above) in a glass Petra dish, followed by pouring over the master a mixture of polydimethlysiloxane (PDMS, Sylgard 184, Dow Corning, Midland, Mich.) in the ratio of 10:1 (v:v) monomer to initiator. After one hour degassing the elastomer was cured for 2 h at 60° C., and then gently peeled from the master and inspected by optical microscopy.

Hole Array of Dots

Figure 2:
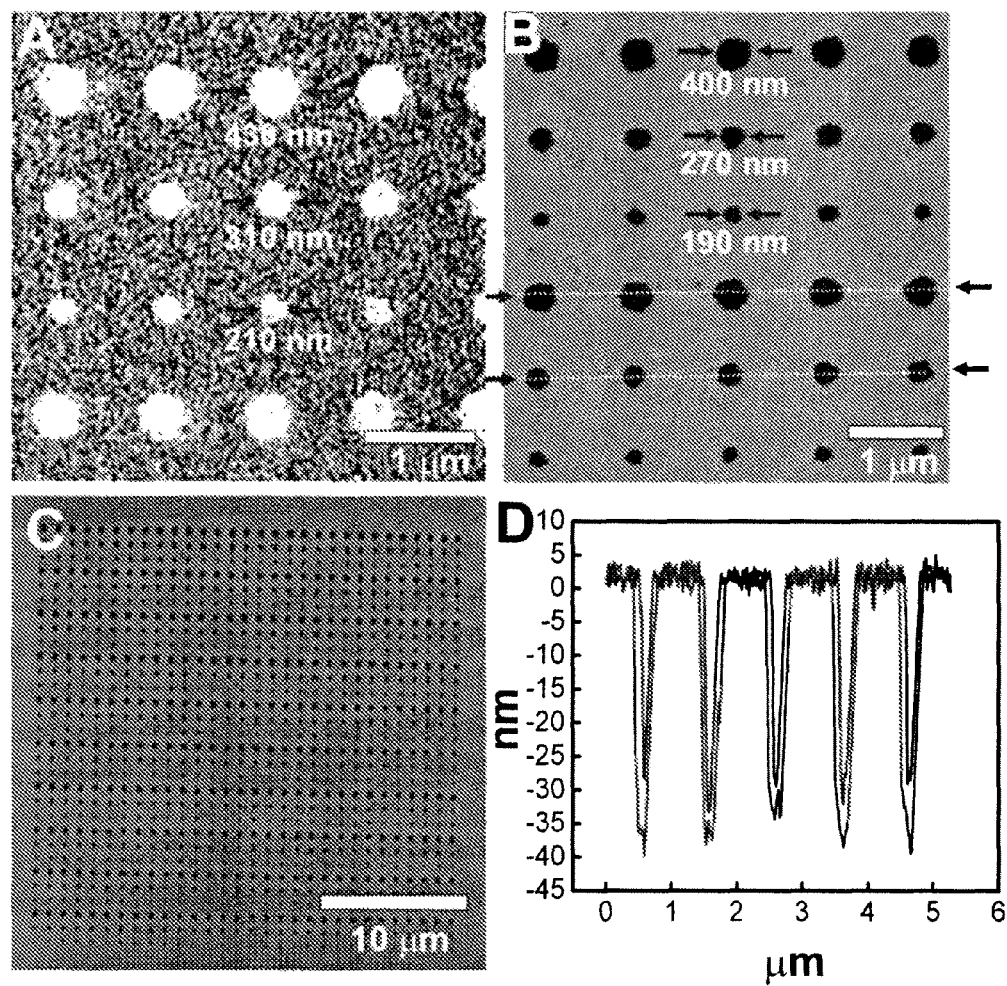
FIGS. 2(A)-(D) present AFM data related to DPN generated hole arrays and arrays of solid state features. (A) is an lateral force microscopy (LFM) image of part of an array of 30×30 MHA structures that includes rows of dots (4, 2, and 1 sec hold time) with 430, 310, and 210 nm average dot diameters (±20 nm) generated using DPN on a 40 nm thick Au film evaporated on a $SiO_x$ substrate. (B) is non-contact mode AFM (NCAFM) image of an array of holes (380, 270, and 190 (±20) nm diameter) fabricated in a 40 nm Au film. (C) is NCAFM image of the entire 900 hole array (30×30). (D) Depth profile of two rows of holes as indicated in (B). Note that wider templates generate deeper holes. Z scale is 60 nm for (B) and (C).

FIG. 2A shows an array of 30×30 MHA structures of rows of dots (4, 2, and 1 sec hold time) with 430, 310, and 210 nm average dot diameters (±20 nm) generated using DPN on a 40 nm thick Au film evaporated on a SiO$_x$ substrate. The Au substrate was then passivated in a 5 mM ODT solution for 15 min, and subsequently rinsed with ethanol and Nanopure™ water. To effect selective desorption of the MHA template, a potential of −800 mV (vs Ag/AgCl, 3M NaCl) was applied to the substrate for 5 min. The exposed Au template was etched by holding the sample at open circuit potential (OCP) for 20 min in an alkaline 1 mM KCN solution (the OCP of the ODT protected Au was about −520 mV). Non-contact AFM images (NCAFM) in FIGS. 2B-D indicate that the resulting hole structures are very uniform, as defined by the hole diameter and depth profile, and are consistent with the lateral dimensions and lattice spacings of the DPN-generated MHA template. Interestingly, the hole structures have a lateral diameter about ~10% smaller than that of the original DPN-defined MHA patterns and the average dot diameters were 400 (±21 nm), 270 (±21 nm), and 190 (±27 nm) for the dots prepared with 4, 2, and 1 sec holding times, respectively (n=14). Although the embodiments described herein are not limited by theory of operation, the difference between MHA feature size and hole size may be the result of the exchange of adsorbed MHA with the ODT in solution at the periphery of the MHA features, which has previously been investigated in the context of DPN deposited structures (43).

The depth of the holes is proportional to the diameter of the MHA-defined templates. For example, the 430 nm diameter templates yielded holes with an average depth of 40±3 nm, whereas the 310 nm diameter templates had an average depth of 37±4 nm, and the 210 nm diameter templates had an average depth of 30±3 nm, see FIG. 2D. Gold remains at the bottom of each hole in all cases.

Figure 3:
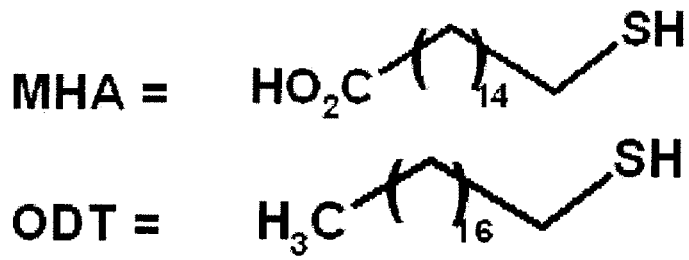
FIG. 3 presents chemical structures of MHA and ODT and cyclic voltammograms for bulk reductive desorption of ODT and MHA monolayers on Au in 0.5 M KOH at a scan rate of 100 mV s$^{-1}$. The vertical lines indicate the boundaries of electrochemical desorption for MHA and ODT, and the highlighted region (−800 mV>$E_{des}$>−850 mV) indicates the potential, where MHA is selectively desorbed, whereas ODT remains intact.
Figure 3:
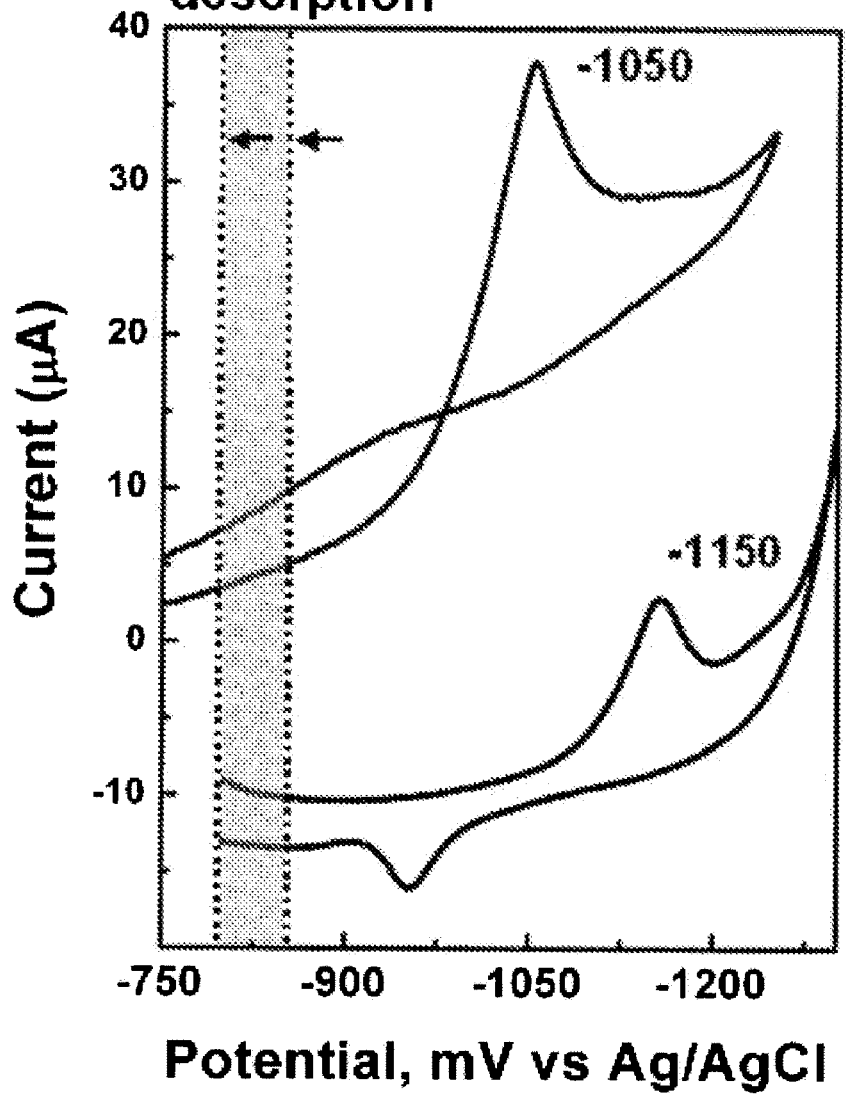

Crooks and coworkers examined the corrosion of Au <111> under potential control in CN$^-$ solution and found that the etching rate of bare Au is considerably faster than that of 1-hexadecanethiol monolayer passivated Au (44, 45). Exclusive etching of the Au surface at the areas defined by the template created by MHA desorption indicates that the majority of MHA molecules are indeed reductively removed at the applied potential of −800 mV. This process is highly sensitive to the applied potential. For example, if the applied potential is −850 mV, ODT desorption starts to occur, and as a result randomly dispersed pits across the Au samples can be observed, see "Dependence on the Applied Potential" below. Alternatively, holding an MHA patterned Au substrate at −750 mV for 5 min, and exposing it to a CN$^-$ etch solution for 20 min does not result in etching of the MHA defined regions, see "Dependence on the Applied Potential" below. Although MHA desorption is induced at all potentials more negative than −800 mV, only within a relatively small window (−800 mV>$E_{des}$>−850 mV) does selective desorption for MHA over ODT occur, see shaded area, FIG. 3.

Figure 4:
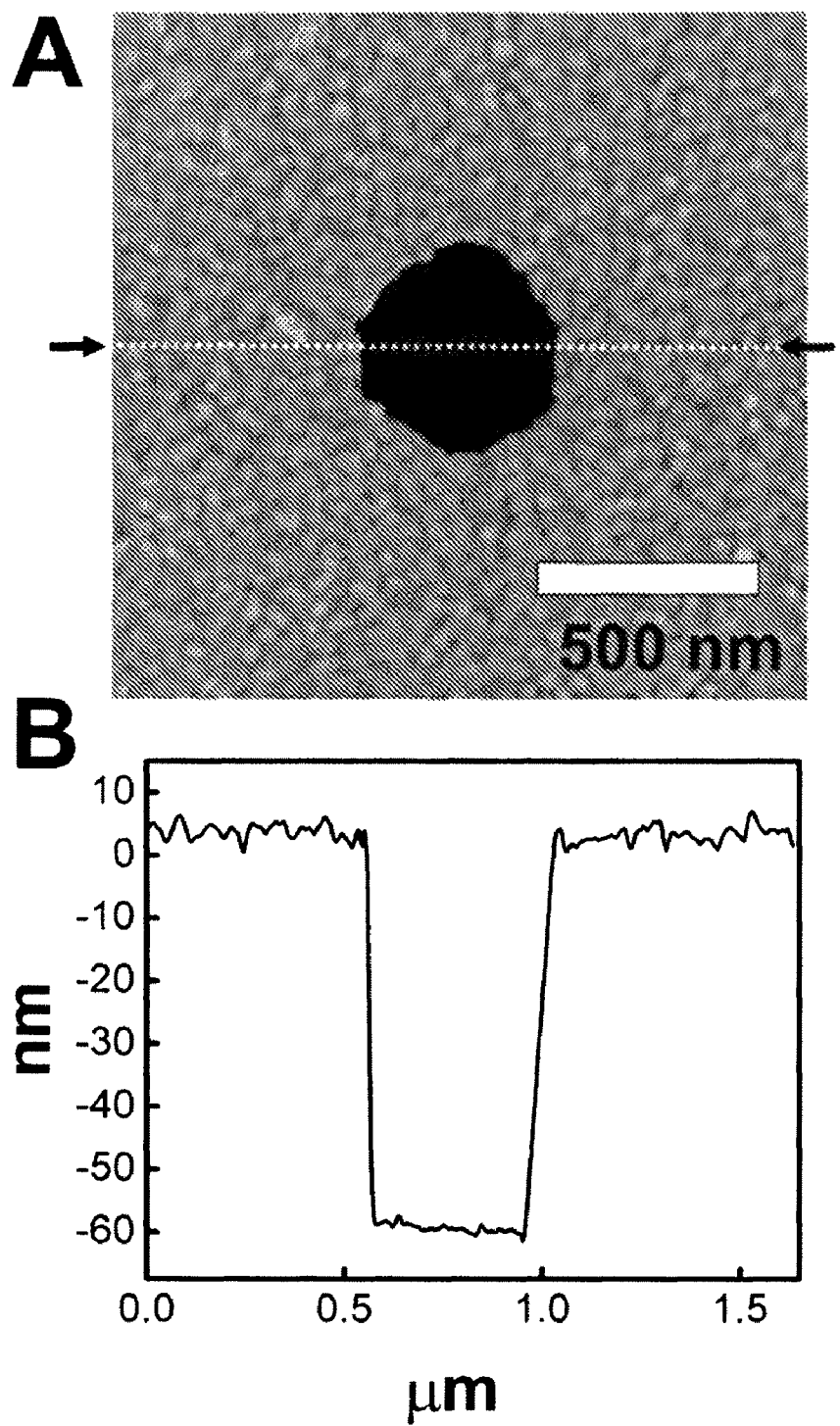
FIGS. 4(A) and (B) present AFM data for a hole etched in a 60 nm polycrystalline gold film. (A) is NCAFM of the etched hole. The faceted hole shape, which reflects the predominant Au (111) character of the evaporated film. (B) is a depth profile of highlighted region in the NCAFM image. The hole was etched down to the Ti/SiO$_x$ substrate base, which explains why the base of the hole is smoother than the polycrystalline top of the Au film.

When the hole arrays are exposed to $CN^-$ solution for extended periods of time (e.g., 30 min), some of the fabricated holes reveal a highly faceted structure with three-fold symmetry, see FIG. 4. Although the embodiments described herein are not limited by theory of operation, this three-fold symmetry may reflect the predominant Au<111> character of the evaporated Au films on Ti coated silicon oxide and glass substrates (46). These results are in agreement with STM observations by Bard and McCarley of triangular etch pits formed during etching of single crystal Au<111> in aqueous $CN^-$ solutions (47).

Figure 8:
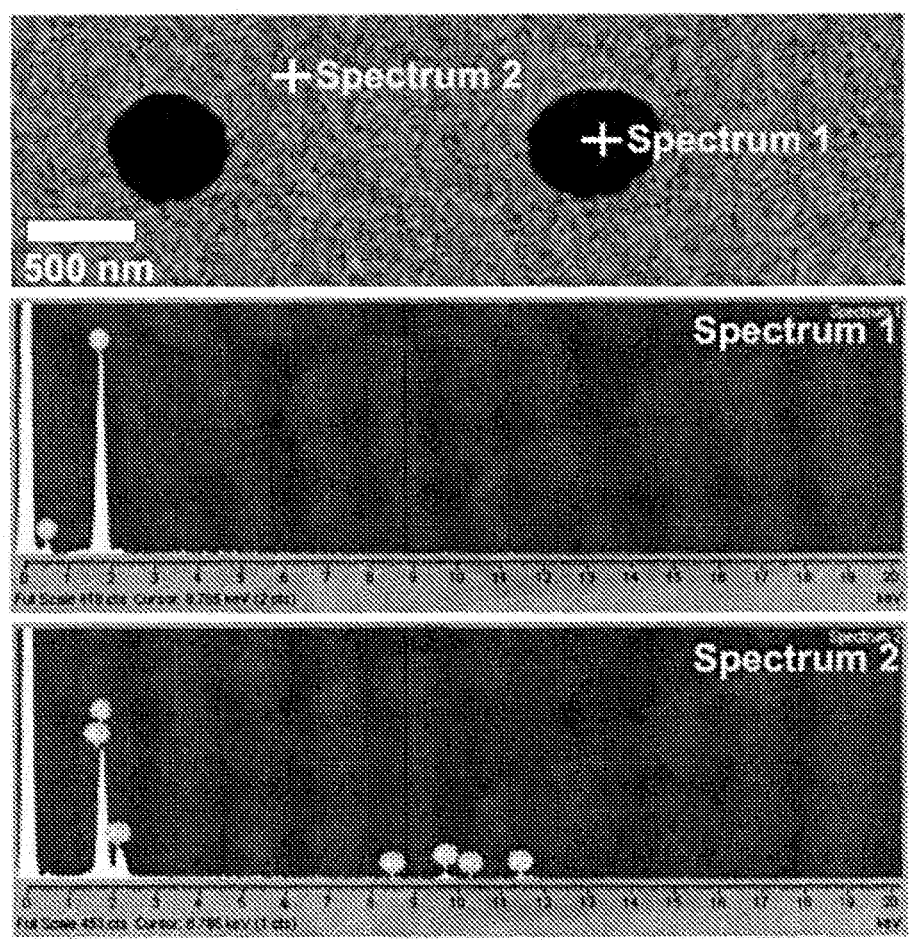
FIGS. 8(A)-(C) present EDS analysis of DPN-templated hole structures in Au film. A) FESEM image of DPN-templated holes. B) and C) EDS analysis of highlighted regions "+" in SEM image, where spectrum 1 corresponds to hole structure and spectrum 2 corresponds to ODT passivated Au. Spectrum 2 exclusively shows the elemental peaks associated with SiO$_x$, and spectrum 1 exhibits the elemental peaks associated with both Au and SiO$_x$.

Another feature of these etch pits is that once all of the Au is etched, the base of each hole is extremely flat because the grain size of Ti/$SiO_x$ (~5-10 nm) is smaller than that of Au (~30-50 nm) (compare FIGS. 4A and 4B). The chemical composition of the substrate underneath the DPN-templated nanoholes was confirmed by using energy-dispersive X-ray spectroscopy (EDS) experiments, see FIG. 8. The EDS analysis indicates that the nanoholes exclusively exhibit the characteristic elemental signatures for $SiO_x$, whereas ODT passivated Au exhibits the elemental signatures of both Au and $SiO_x$. In principle, selective immobilization of reagents to the sidewall or the base of the holes is possible, since they present different surfaces with varying reactivity toward thiol and silane groups, respectively.

Desorption Dependence on Applied Potential and Desorption Time

Figure 10:
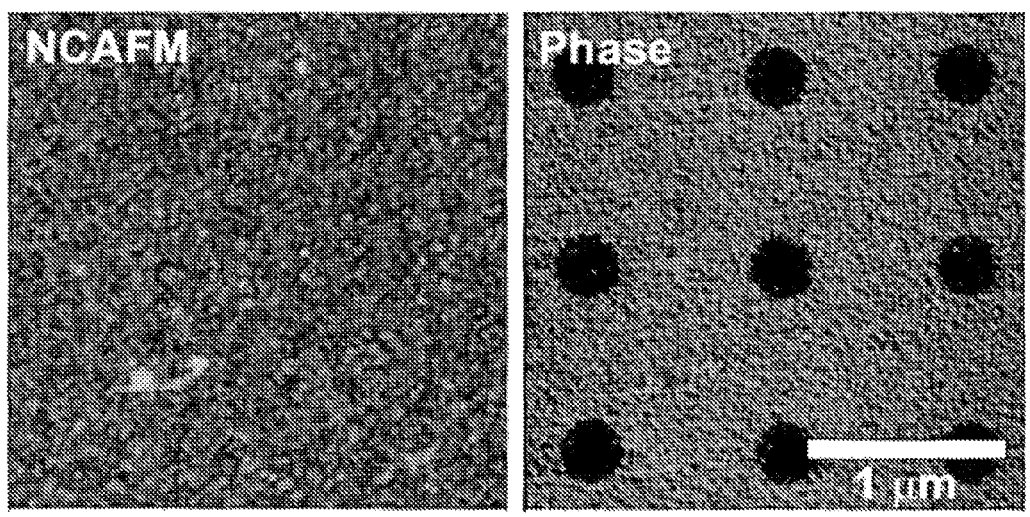
FIG. 10 presents non contact AFM (NCAFM) and phase images of a 3H3 MHA dot array, where the background Au surface was passivated with ODT and a potential of −750 mV was applied for 5 min. The sample was then exposed to 1 mM KCN for 20 min. The MHA structures remain intact and the Au substrate is not etched. Z scale is 20 nm.
Figure 11:
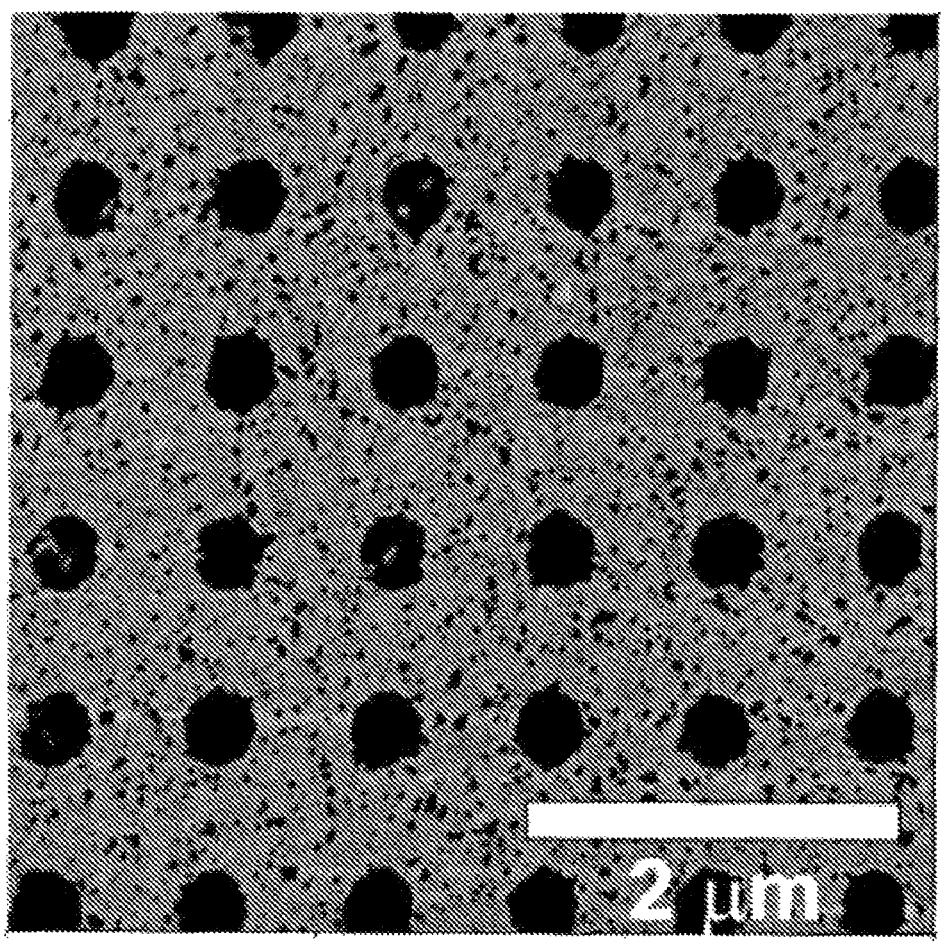
FIG. 11 presents NCAFM image of a hole array generated by applying a potential of −850 mV for 5 min, and subsequently exposing the substrate to an alkaline CN⁻ containing solution at OCP. Note the presence of small pits in the ODT passivating layer. Z scale is 60 nm.

Dependence on the Applied Potential. Desorption potential of ODT and MHA SAMs differ by ~100 mV in 0.5 M KOH solution, see FIG. 3. The onset of electrochemical desorption for MHA perimeter sites was at −750 mV (vs Ag/AgCl in 0.5 M KOH), whereas the onset of electrochemical desorption for ODT perimeter sites was at −850 mV (vs Ag/AgCl in 0.5 M KOH) (1,2). However, once the periphery of the MHA dots are blocked with ODT, electrochemical whittling no longer proceeds at −750 mV, see FIG. 10. Therefore, selective desorption of MHA over ODT does not proceed at potentials equal to or lower than −750 mV. Conversely, if an overpotential of −850 mV is applied for 5 min, desorption of the passivating ODT monolayer start to occur randomly across the substrate, see FIG. 11.

Figure 12:
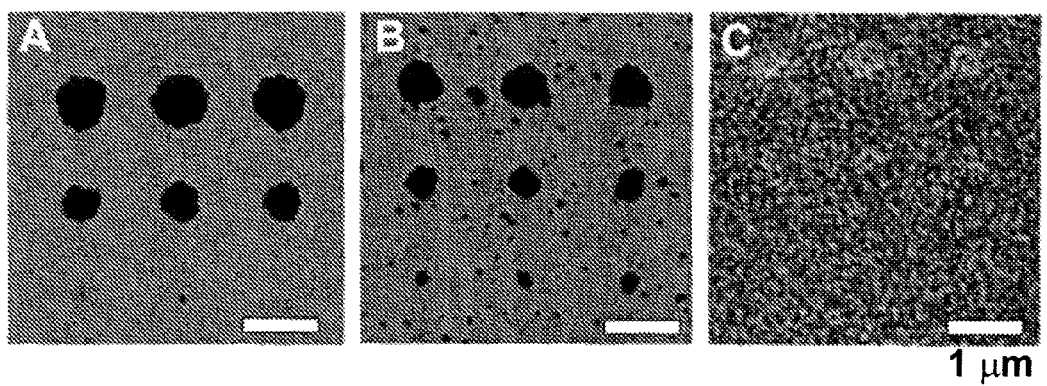
FIGS. 12(A)-(C) present NCAFM images of 3H3 hole arrays generated by applying a selective desorption potential of −800 mV for 5, 8, and 0 min, which correspond to A, B and C, respectively. Z scale is 80 nm for A and B, 10 nm for C.

Dependence on the Desorption Time. Another important parameter that controls the formation of holes is the duration of applied desorption potential. FIG. 12 demonstrates this dependence by showing three different MHA patterned Au substrates, where all the conditions were maintained ($E_{des}$=−800 mV) except for the length of time that the desorption potential was applied. When the desorption pulse is applied for longer periods of time (t=8 min), some desorption of the passivating ODT monolayer occurs, and subsequently the Au surface is pitted, see FIG. 12B. If a desorption pulse is not applied (t=0 min), then both the MHA and ODT structures remain intact, and consequently the Au film is protected, see FIG. 12C. This indicates that in order to minimize damage to the passivating ODT layer, it is important to minimize the length of time that the desorption potential is applied.

Arrays of Triangular Holes

Figure 5:
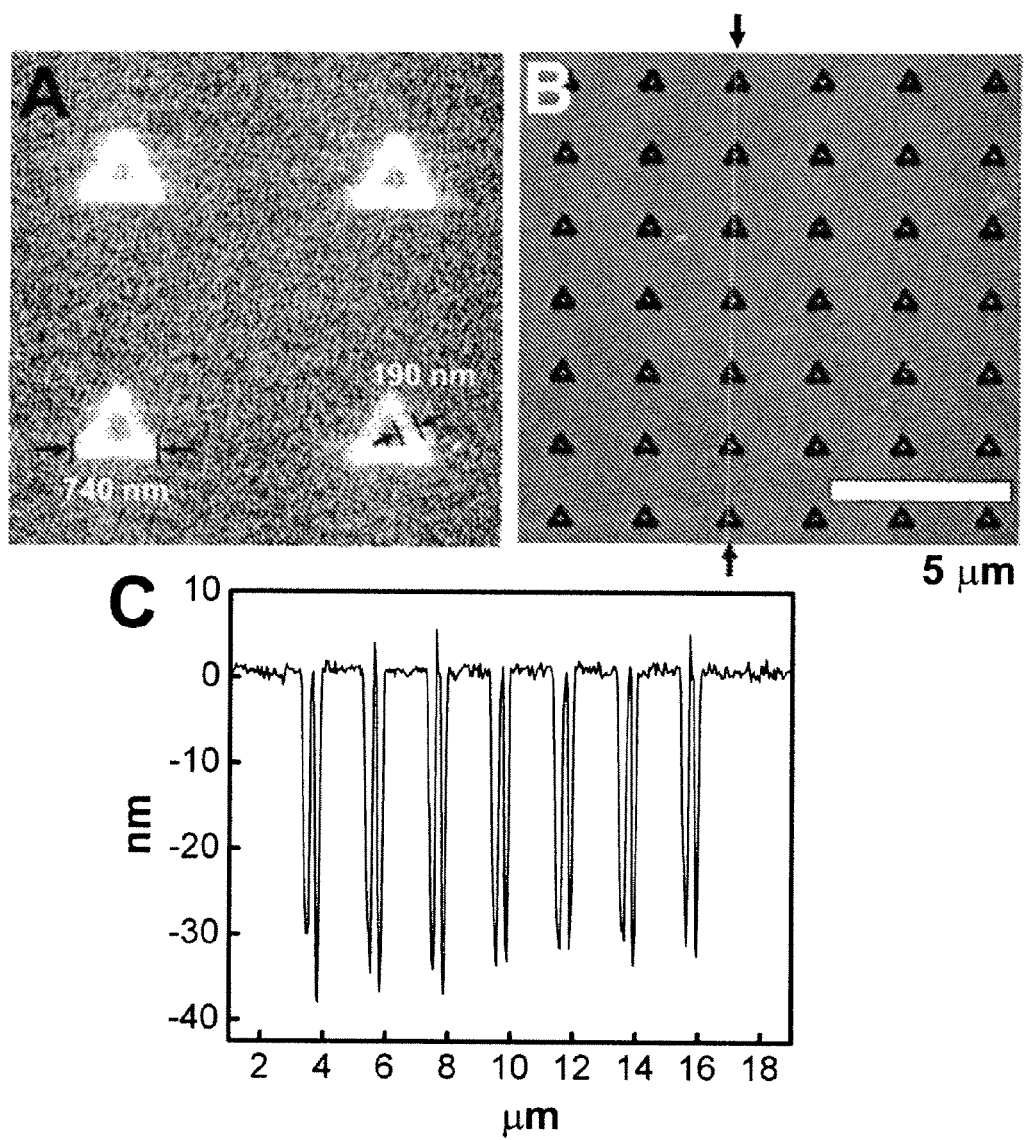
FIGS. 5(A)-(C) present AFM data related to a DPN generated array of triangular holes and array of triangular solid structures. (A) is an LFM image of part of an array of triangular MHA structures written using a 1 µm/s tip speed. The edge length is 740 nm and the line width is 190 nm (±20 nm). (B) is an NCAFM image of the same substrate as in (A) after selective desorption (−800 mV, 5 min) of MHA, and subsequent etching at open circuit potential (10 min). (C) is a depth profile of highlighted region in (B). The average peak depth of all the structures is 34±3 nm.

To demonstrate that this method can be used to generate nanoholes of almost any shape, DPN was used to pattern triangular MHA frames with an edge length of 740±30 nm and a line width of 190±20 nm (FIG. 5A). This was achieved by using a relatively fast tip writing speed (1 μm/s) to avoid filling in the centers of the triangular structures (33). The substrate was then passivated with ODT, and then a potential of −800 mV (vs Ag/AgCl, 3M NaCl) was applied for 5 min. After exposure to the $CN^-$ etch solution, the substrate was imaged by NCAFM (FIG. 5B). The resulting triangular frame shaped holes have an edge length of 730±30 nm, and a line width of 170 nm±25 nm (FIG. 5C). Both the edge length and the line width of the resulting triangle-shaped holes are smaller than the original MHA-defined templates, which is consistent with the dot-shaped structures described above, and again is most likely a result of MHA exchange with the ODT in solution. The average peak depth of the pits was 34 nm±3 nm.

Hole Arrays on Transparent Substrates

Figure 13:
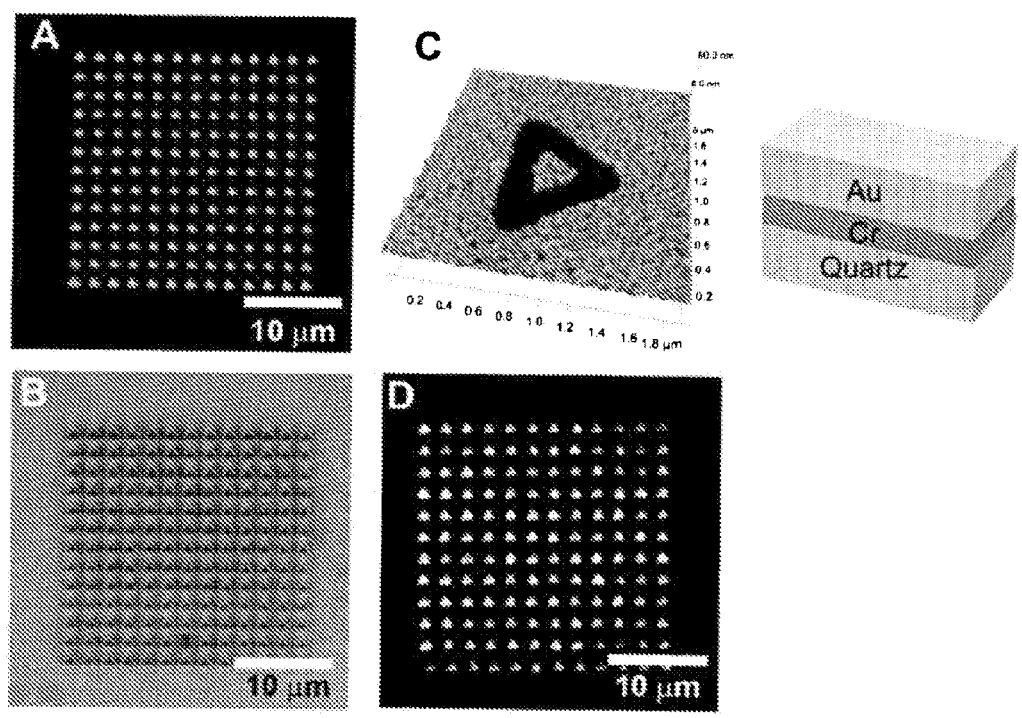
FIGS. 13(A)-(D) demonstrate measuring the optical properties of nanostructured Au films supported on a quartz substrate (scheme right). Optical micrographs of triangular hole array in A) darkfield reflection mode, B) brightfield reflection mode, D) brightfield transmission mode. C) NCAFM image of a representative triangular structure etched in a Au film.

In order to measure the transmission spectra of the DPN-generated hole arrays, it is necessary to use a transparent substrate. Therefore, the selective etching of MHA patterned templates was performed on Au films supported on quartz substrates in place of silicon substrates. The quality of hole arrays generated on quartz was comparable to those on native-oxide coated silicon, see FIG. 13, although the silicon substrates contained a smaller density of dust and defects. The transmission mode micrograph of the triangular hole arrays appeared to have a slight bluish-green color, which indicated that the nanostructured Au film interacts with transmitted light.

Selective Electrodeposition of Metal Salts

Figure 6:
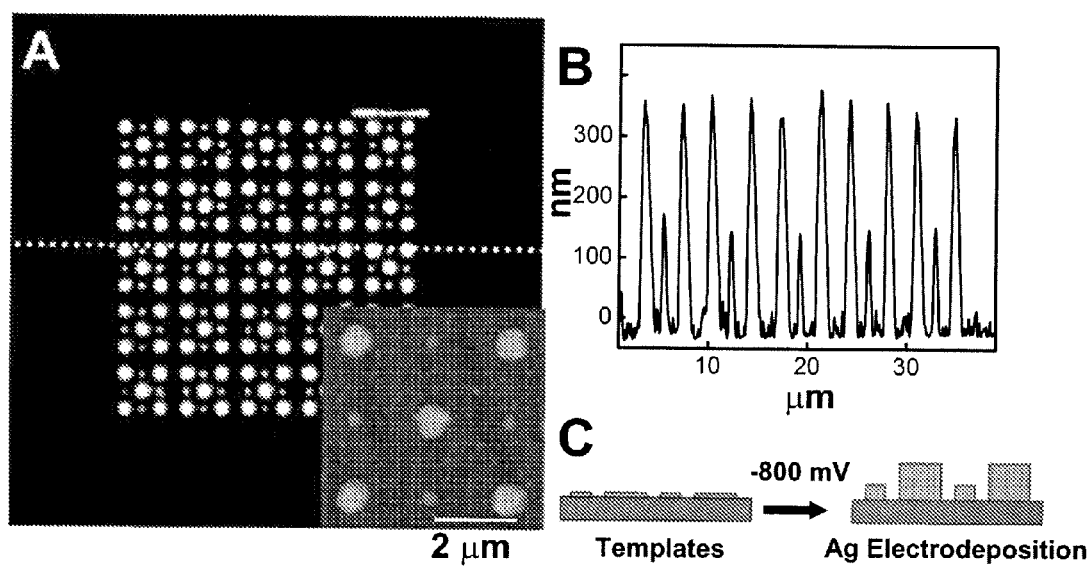
FIGS. 6(A)-(C) relate to an array of Ag structures created using a DPN generated hole array as a template. (A) is a dark field microscopy image of an array of 15×15 Ag structures generated on a polycrystalline Au substrate. Ag structures were electroplated onto MHA defined dot templates with alternating diameters. The inset is an AFM image of a part of the array. (B) is a height profile of the array of (A). (C) schematically illustrates generation of an array of Ag structures from a hole array (template).

Bare Au templates also can be used to direct the selective electrodeposition of metal salts, see FIG. 1. To demonstrate this capability, an array of 15×15 MHA dots with alternating diameters of 1 μm and 400 nm was generated on a polycrystalline Au substrate. The substrate was then passivated with ODT by immersing it in a 5 mM ODT solution for 15 min. After rinsing with ethanol and water, the MHA portion of the patterned substrate was then selectively desorbed at a potential of −800 mV (vs Ag/AgCl, 3M NaCl) for 5 min. Ag structures were then electrodeposited from a commercial Ag plating bath (Tetronics 1025 Ag plating solution, containing $KAg(CN)_2$) by applying a potential of −800 mV for another 5 min. The resulting Ag structures had a hemispherical shape and were characterized using darkfield microscopy and AFM imaging (FIG. 6). The height of the Ag features can be controlled by adjusting the total number of coulombs passed in the experiment, and the lateral dimension of the Ag structures is defined by the original MHA patterns.

Figure 9:
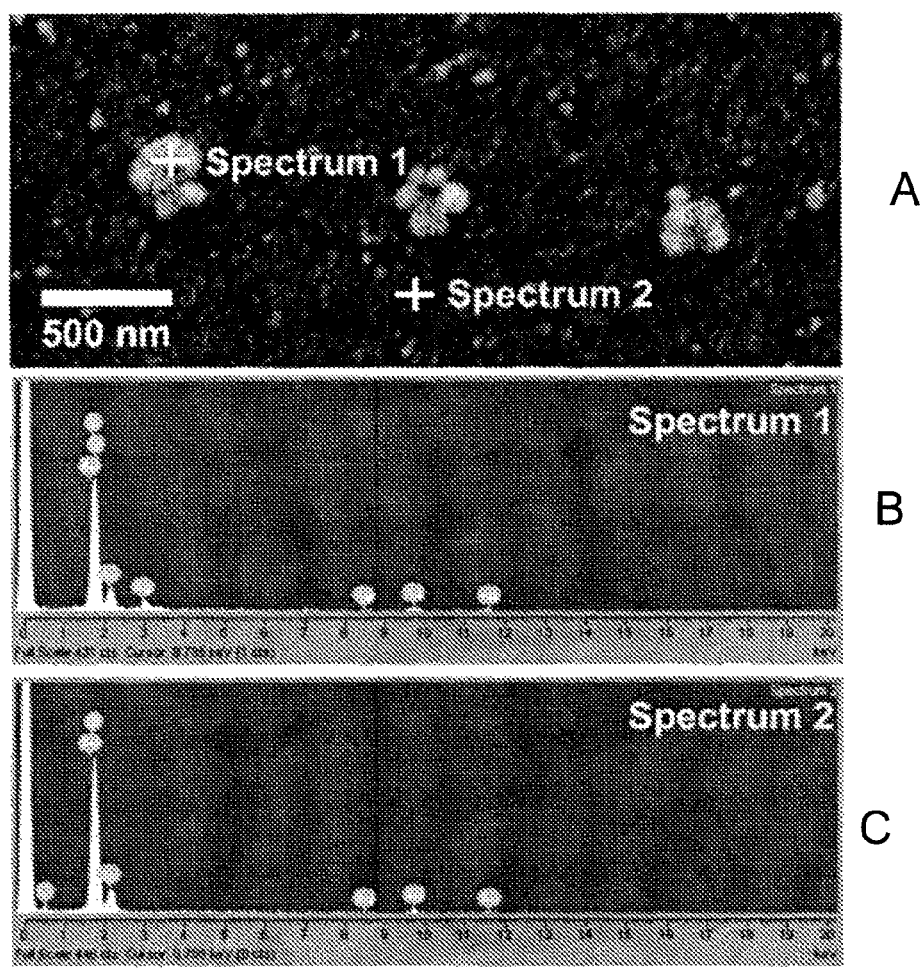
FIGS. 9(A)-(C) present EDS analysis of DPN-templated Ag structures electrodeposited on Au film. A) FESEM image of DPN-defined Ag dot shaped structures. B) and C) EDS analysis of highlighted regions "+" in SEM, where spectrum 1 corresponds to an Ag structure and spectrum 2 corresponds to an ODT passivated Au region. Spectrum 1 exhibits the characteristic elemental signatures for both Au and Ag, while spectrum 2 exhibits the characteristic elemental signatures for Au exclusively.

400 nm diameter dots resulted in Ag structures with a diameter of 550±70 nm and a height of 150±20 nm, whereas the 1 μm diameter features yielded 1.27±0.15 μm diameter Ag structures with a height of 380±20 nm. It is important to note that the resulting Ag structures have a hemispherical shape since it is equally likely that Ag deposits will grow from all directions after the Ag grows beyond the height of the ODT barrier layer (2.2 nm). The rate of growth shows similar behavior to that observed with the nanohole arrays, see FIG. 2, where larger diameter templates generated deeper holes, see FIG. 6C. Although the reason for this is unclear, this phenomena is likely not the result of diffusion controlled Ag particle growth since that would result in smaller templates growing faster than larger ones (49). The chemical composition of DPN-templated nanoscale Ag structures was confirmed by using EDS experiments, see FIG. 9. The EDS analysis of Ag electrodeposited structures exhibits the characteristic elemental signatures for both Au and Ag, whereas the background Au surface exhibits elemental signatures for Au exclusively.

Making PDMS Stamps

Polydimethylsiloxane (PDMS) stamping is widely used as an inexpensive high-throughput technique to generate μm scale features over large areas (18). However, expensive and precise photolithographic masks are typically used to make the micropatterned PDMS, and each pattern modification, such as shape, size or spacing, requires designing a new mask. One application of DPN templated solid features can be a master, from which a large number of duplicate structures could be generated. Due to its widespread applicability, PDMS was chosen to replicate DPN templated features.

Figure 7:
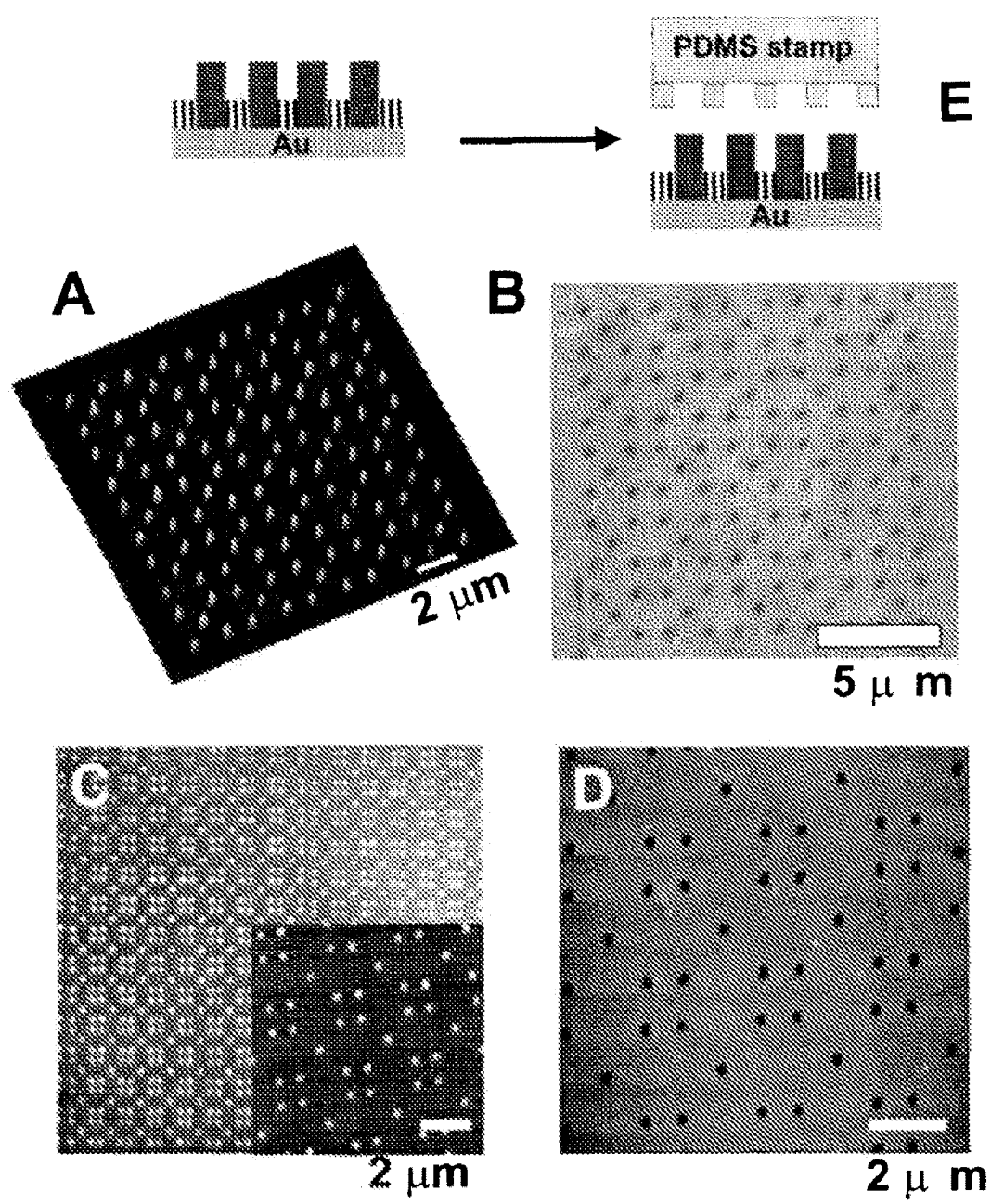
FIGS. 7(A)-(E) relate to a PDMS array created using a array of Ag structures as a template. (A) is an AFM image of electrodeposited Ag "master" on DPN-defined templates. (B) is an optical micrograph of a PDMS "replica" faithfully reproducing the master from A. (C) is an optical micrograph of an array of Ag "masters". The inset shows a representative AFM image of part of the array. (D) is an AFM image a of PDMS mold replicated from the Ag master shown in C. (E) is a schematic representation of the process of molding PDMS "replicas" from DPN-defined "masters".

The PDMS monomer and initiator were poured over an array of Ag structures, as shown in FIG. 7, and the PDMS was allowed to cure overnight at 60° C. The PDMS was then peeled, removed and imaged using optical microscopy, and dot-shaped pits with identical geometry and dimensions as the original Ag master were faithfully replicated, see FIG. 7B. For example, 350 nm wide Ag dots with alternating 1 and 2 μm spacings in an array were generated on Au, see FIG. 7C. AFM images of the PDMS replica indicate that the features were accurately reproduced, and 350 nm recessions were generated on the PDMS surface, see FIG. 7D. Although it may be possible to replicate sub-50 features using this approach, conventional PDMS stamping usually fails when the feature size is below 500 nm (50).

The combination of high-resolution alkanethiol patterning with selective electrochemical control provides a simple and flexible approach for using alkanethiol as positive etch resists on Au. Both the magnitude and the duration of the applied potential play a significant role in controlling the selective desorption of the alkanethiol adsorbates. The technique demonstrates that DPN-templates can be used effectively to direct the selective etching of Au and the selective electrodeposition of Ag to nanopatterned regions of the substrates. Electrochemical control of patterned adsorbates can be applied to generate structures over large areas at the nanometer length scale.

List of References (1) Rosi, N. L.; Mirkin, C. A. *Chemical Reviews* 2005, 105, 1547-1562.

(2) Ebbesen, T. W.; Lezec, H. J.; Ghaemi, H. F.; Thio, T.; Wolff, P. A. *Nature* 1998, 391, 667-669.

(3) Kumar, A.; Biebuyck, H. A.; Whitesides, G. M. *Langmuir* 1994, 10, 1498-1511.

(4) Gillen, G.; Wight, S.; Bennett, J.; Tarlov, M. J. *Applied Physics Letters* 1994, 65, 534-536.

(5) Sondaghuethorst, J. A. M.; Vanhelleputte, H. R. J.; Fokkink, L. G. J. *Applied Physics Letters* 1994, 64, 285-287.

(6) Zharnikov, M.; Geyer, W.; Golzhauser, A.; Frey, S.; Grunze, M. *Physical Chemistry Chemical Physics* 1999, 1, 3163-3171.

(7) Golzhauser, A.; Geyer, W.; Stadler, V.; Eck, W.; Grunze, M.; Edinger, K.; Weimann, T.; Hinze, P. *Journal of Vacuum Science & Technology B* 2000, 18, 3414-3418.

(8) Marrian, C. R. K.; Perkins, F. K.; Brandow, S. L.; Koloski, T. S.; Dobisz, E. A.; Calvert, J. M. *Applied Physics Letters* 1994, 64, 390-392.

(9) Dulcey, C. S.; Georger, J. H.; Krauthamer, V.; Stenger, D. A.; Fare, T. L.; Calvert, J. M. *Science* 1991, 252, 551-554.

(10) Calvert, J. M.; Chen, M. S.; Dulcey, C. S.; Georger, J. H.; Peckerar, M. C.; Schnur, J. M.; Schoen, P. E. *Journal of Vacuum Science & Technology B* 1991, 9, 3447-3450.

(11) Kramer, S.; Fuierer, R. R.; Gorman, C. B. *Chemical Reviews* 2003, 103, 4367-4418.

(12) Geyer, W.; Stadler, V.; Eck, W.; Zharnikov, M.; Golzhauser, A.; Grunze, M. *Applied Physics Letters* 1999, 75, 2401-2403.

(13) Golzhauser, A.; Eck, W.; Geyer, W.; Stadler, V.; Weimann, T.; Hinze, P.; Grunze, M. *Adv Mater* 2001, 13, 806-+.

(14) Felgenhauer, T.; Yan, C.; Geyer, W.; Rong, H. T.; Golzhauser, A.; Buck, M. *Applied Physics Letters* 2001, 79, 3323-3325.

(15) Volkel, B.; Kaltenpoth, G.; Handrea, M.; Sahre, M.; Nottbohm, C. T.; Kuller, A.; Paul, A.; Kautek, W.; Eck, W.; Golzhauser, A. *Surface Science* 2005, 597, 32-41.

(16) Kaltenpoth, G.; Volkel, B.; Nottbohm, C. T.; Golzhauser, A.; Buck, M. *Journal of Vacuum Science & Technology B* 2002, 20, 2734-2738.

(17) Zhou, C. Z.; Nagy, G.; Walker, A. V. *J Am Chem Soc* 2005, 127, 12160-12161.

(18) Gates, B. D.; Xu, Q. B.; Stewart, M.; Ryan, D.; Willson, C. G.; Whitesides, G. M. *Chemical Reviews* 2005, 105, 1171-1196.

(19) Ginger, D. S.; Zhang, H.; Mirkin, C. A. *Angew Chem Int Edit* 2004, 43, 30-45.

(20) Piner, R. D.; Zhu, J.; Xu, F.; Hong, S. H.; Mirkin, C. A. *Science* 1999, 283, 661-663.

(21) Pesika, N. S.; Fan, F. Q.; Searson, P. C.; Stebe, K. J. *J Am Chem Soc* 2005, 127, 11960-11962.

(22) Hong, S. H.; Zhu, J.; Mirkin, C. A. *Science* 1999, 286, 523-525.

(23) Hong, S. H.; Zhu, J.; Mirkin, C. A. *Langmuir* 1999, 15, 7897-7900.

(24) Noy, A.; Miller, A. E.; Klare, J. E.; Weeks, B. L.; Woods, B. W.; DeYoreo, J. J. *Nano Lett* 2002, 2, 109-112.

(25) Demers, L. M.; Ginger, D. S.; Park, S. J.; Li, Z.; Chung, S. W.; Mirkin, C. A. *Science* 2002, 296, 1836-1838.

(26) Lim, J. H.; Ginger, D. S.; Lee, K. B.; Heo, J.; Nam, J. M.; Mirkin, C. A. *Angew Chem Int Edit* 2003, 42, 2309-2312.

(27) Lim, J. H.; Mirkin, C. A. *Adv Mater* 2002, 14, 1474-+.

(28) Liu, X. G.; Fu, L.; Hong, S. H.; Dravid, V. P.; Mirkin, C. A. *Adv Mater* 2002, 14, 231-+.

(29) Zhang, H.; Lee, K. B.; Li, Z.; Mirkin, C. A. *Nanotechnology* 2003, 14, 1113-1117.

(30) Zhang, H.; Chung, S. W.; Mirkin, C. A. *Nano Lett* 2003, 3, 43-45.

(31) Zhang, H.; Jin, R. C.; Mirkin, C. A. *Nano Lett* 2004, 4, 1493-1495.

(32) Zhang, H.; Li, Z.; Mirkin, C. A. *Adv Mater* 2002, 14, 1472-+.

(33) Zhang, H.; Mirkin, C. A. *Chemistry of Materials* 2004, 16, 1480-1484.

(34) Saalmink, M.; van der Marel, C.; Stapert, H. R.; Burdinski, D. *Langmuir* 2006, 22, 1016-1026.

(35) Delamarche, E.; Geissler, M.; Wolf, H.; Michel, B. *J Am Chem Soc* 2002, 124, 3834-3835.

(36) Widrig, C. A.; Chung, C.; Porter, M. D. *Journal of Electroanalytical Chemistry* 1991, 310, 335-359.

(37) Walczak, M. M.; Popenoe, D. D.; Deinhammer, R. S.; Lamp, B. D.; Chung, C. K.; Porter, M. D. *Langmuir* 1991, 7, 2687-2693.

(38) Imabayashi, S.; Iida, M.; Hobara, D.; Feng, Z. Q.; Niki, K.; Kakiuchi, T. *Journal of Electroanalytical Chemistry* 1997, 428, 33-38.

(39) Zhang, Y.; Salaita, K.; Lim, J. H.; Mirkin, C. A. *Nano Lett* 2002, 2, 1389-1392.

(40) Zhang, Y.; Salaita, K.; Lim, J. H.; Lee, K. B.; Mirkin, C. A. *Langmuir* 2004, 20, 962-968.

(41) Hobara, D.; Miyake, O.; Imabayashi, S.; Niki, K.; Kakiuchi, T. *Langmuir* 1998, 14, 3590-3596.

(42) Salaita, K.; Lee, S. W.; Wang, X. F.; Huang, L.; Dellinger, T. M.; Liu, C.; Mirkin, C. A. *Small* 2005, 1, 940-945.

(43) Ivanisevic, A.; McCumber, K. V.; Mirkin, C. A. *J Am Chem Soc* 2002, 124, 11997-12001.

(44) Zamborini, F. P.; Crooks, R. M. *Langmuir* 1997, 13, 122-126.

(45) Li, Y. Q.; Chailapakul, O.; Crooks, R. M. *Journal of Vacuum Science & Technology B* 1995, 13, 1300-1306.

(46) Hallmark, V. M.; Chiang, S.; Rabolt, J. F.; Swalen, J. D.; Wilson, R. *J. Physical Review Letters* 1987, 59, 2879-2882.

(47) McCarley, R. L.; Bard, A. J. *Journal of Physical Chemistry* 1992, 96, 7410-7416.

(48) Dintinger, J.; Degiron, A.; Ebbesen, T. W. *Mrs Bulletin* 2005, 30, 381-384.

(49) Penner, R. M. *J Phys Chem B* 2002, 106, 3339-3353.

(50) Odom, T. W.; Love, J. C.; Wolfe, D. B.; Paul, K. E.; Whitesides, G. M. *Langmuir* 2002, 18, 5314-5320.

(51) Weinberger, D. A.; Hong, S. G.; Mirkin, C. A.; Wessels, B. W.; Higgins, T. B. Combinatorial generation and analysis of nanometer- and micrometer-scale silicon features via "dip-pen" nanolithography and wet chemical etching. *Adv Mater* 2000, 12, 1600.

Although the foregoing refers to particular preferred embodiments, it will be understood that the presently described inventions are not so limited. It will occur to those of ordinary skill in the art that various modifications may be made to the disclosed embodiments and that such modifications are intended to be within the scope of the presently claimed inventions.

All of the publications, patent applications and patents cited in this specification are incorporated herein by reference in their entirety.

What is claimed is:

1. A method comprising
   providing a tip with at least a first compound disposed thereon and a substrate;
   transferring the first compound from the tip to a surface of the substrate to produce a patterned area;
   after the patterned area is formed, depositing a second compound on a non-patterned area of the surface by exposing the substrate to the second compound;
   selectively removing the first compound from the patterned area of the surface so that the second compound on the non-patterned area of the surface remains deposited on the non-patterned area; and
   then etching the patterned area of the surface.

2. The method of claim 1, wherein the surface of the substrate is a metal surface.

3. The method of claim 1, wherein the substrate comprises a semiconductor.

4. The method of claim 1, wherein the substrate comprises a transparent material.

5. The method of claim 1, wherein the tip is a scanning probe microscope tip.

6. The method of claim 1, wherein the tip is an atomic force microscope tip.

7. The method of claim 1, wherein the tip is a hollow tip.

8. The method of claim 1, wherein the tip is a non-hollow tip.

9. The method of claim 1, wherein the first compound is chemisorbed to the surface.

10. The method of claim 1, wherein the first compound is a sulfur-containing compound.

11. The method of claim 1, wherein the first compound forms a self-assembled monolayer on the patterned area of the surface.

12. The method of claim 1, wherein the second compound is chemisorbed on the surface.

13. The method of claim 1, wherein the second compound is a sulfur-containing compound.

14. The method of claim 1, wherein the depositing the second compound results in forming of a self-assembled monolayer.

15. The method of claim 1, wherein the depositing the second compound comprises immersing the substrate in a solution comprising the second compound.

16. The method of claim 1, wherein a desorption potential of the second compound is higher than a desorption potential of the first compound.

17. The method of claim 1, wherein the removing comprises desorbing the first compound from the patterned area of the surface.

18. The method of claim 17, wherein said desorbing is performed electrochemically.

19. The method of claim 1, wherein the first compound is 16-mercaptohexadecanoic acid (MHA) and the second compound 1-octadecanethiol.

20. The method of claim 1, wherein the patterned area forms an array.

21. The method of claim 1, wherein the patterned area comprises lines or dots.

22. The method of claim 1, wherein the patterned area after etching is characterized by gap features with lateral dimensions of about 500 nm or less.

23. The method of claim 1, wherein the patterned area after etching is characterized by gap features with lateral dimensions of about 200 nm or less.

24. The method of claim 1, wherein the patterned area after etching is characterized by gap features with lateral dimensions of about 100 nm or less.

25. A method comprising providing a nanoscopic tip and a solid substrate;
   disposing a composition comprising a first compound on the tip; depositing the first compound from the tip to a surface of the substrate to produce a patterned area, wherein the first compound forms a self-assembled monolayer on the surface; depositing a second compound on a non-patterned area of the surface by exposing the substrate to the second compound, wherein the second compound forms a self-assembled monolayer on the surface;
   selectively electrochemically removing the first compound from the patterned area of the surface so that the second compound on the non-patterned area of the surface remains deposited on the non-patterned area; and etching the patterned area of the surface.

26. A method comprising
   providing a tip and a substrate;
   applying a first compound from the tip to a surface of the substrate to produce a patterned area;
   depositing a second compound on a non-patterned area of the surface by exposing the substrate to the second compound;
   selectively removing the first compound from the patterned area of the surface so that the second compound on the non-patterned area of the surface remains deposited on the non-patterned area, wherein the removing comprises electrochemically desorbing the first compound from the patterned area of the surface; and
   then etching the patterned area of the surface.

* * * * *